(12) United States Patent
Blomme

(10) Patent No.: US 8,263,459 B2
(45) Date of Patent: Sep. 11, 2012

(54) METHOD FOR FORMING A FLOATING GATE NON-VOLATILE MEMORY CELL

(75) Inventor: Pieter Blomme, Heverlee (BE)

(73) Assignee: IMEC, Leuven (BE)

( * ) Notice: Subject to any disclaimer, the term of this patent is extended or adjusted under 35 U.S.C. 154(b) by 111 days.

(21) Appl. No.: 12/836,545

(22) Filed: Jul. 14, 2010

(65) Prior Publication Data

US 2011/0039380 A1 Feb. 17, 2011

(30) Foreign Application Priority Data

Aug. 12, 2009 (EP) ..................................... 09167749

(51) Int. Cl.
*H01L 21/336* (2006.01)
(52) U.S. Cl. .................. 438/265; 438/696; 257/E21.624
(58) Field of Classification Search .................. 438/264, 438/265, 694, 696, 700, 701; 257/E21.422, 257/E21.234, E21.621, E21.624
See application file for complete search history.

(56) References Cited

U.S. PATENT DOCUMENTS 7,585,730 B1 9/2009 Song et al.
2006/0292802 A1 12/2006 Lee et al.
2008/0074920 A1 3/2008 Chien et al.

FOREIGN PATENT DOCUMENTS

| EP | 1605517 | 12/2005 |
| EP | 1748472 | 1/2007 |
| EP | 1903602 | 3/2008 |

OTHER PUBLICATIONS

European Search Report, European Patent Application 09167749.2 dated Dec. 8, 2009.

*Primary Examiner* — Julio J Maldonado
*Assistant Examiner* — Sonya McCall Shepard
(74) *Attorney, Agent, or Firm* — McDonnell Boehnen Hulbert & Berghoff LLP

(57) ABSTRACT

Method for manufacturing a non-volatile memory comprising at least one array of memory cells on a substrate of a semiconductor material, the memory cells being self-aligned to and separated from each other by STI structures, the memory cells comprising a floating gate having an inverted-T shape in a cross section along the array of memory cells, wherein the inverted T shape is formed by oxidizing an upper part of the sidewalls of the floating gates thereby forming sacrificial oxide, and subsequently removing the sacrificial oxide simultaneously with further etching back the STI structures.

16 Claims, 20 Drawing Sheets

METHOD FOR FORMING A FLOATING GATE NON-VOLATILE MEMORY CELL

TECHNICAL FIELD

The invention relates to a method for manufacturing a non-volatile memory array comprising at least one array of memory cells on a substrate of a semiconductor material, according to the preamble of the first claim.

BACKGROUND ART

Such non-volatile memory structures are e.g. known in the art as flash memory devices, whereby the memory function is implemented by storing electrical charges on memory cells known as floating gates. Two well known types of such flash memory devices are NAND flash and NOR flash. There is a constant pressure to make cheaper memory devices with a higher storage capacity, which is a.o. addressed by constant miniaturization, different memory topologies, better process and yield control. Particularly relevant for the present invention are memory cell structures with a floating gate having an inverted T shape.

US20060292802 describes a NAND flash memory device and a method for forming the same. The memory structure comprises elements with an inverted T shape, fabricated from box-shaped parts, the sides of which are narrowed by etching. A disadvantage of the method used in US20060292802 is that the process is complex and extra process steps are needed to prevent etching damage.

US20080074920 describes a 2-dimensional non-volatile memory array, wherein each memory cell comprises a floating gate, the floating gate having an inverted T shape in cross section. Methods are described to form these inverted T shapes, whereby a first floating gate layer is deposited on top of a dielectric layer, to form the lower (horizontal) side of the inverted T shape, and a second floating gate layer, forming the upright (vertical) part of the floating gate, is deposited on top of the first floating gate layer. In a first method, the upright part of the floating gate is formed by filling slots between sidewall spacers formed against masking portions deposited on top of the first floating gate layer. In a second method, the upright part of the floating gate is formed by filling slots between sidewall spacers formed against Shallow Trench Isolation (STI) structures, extending above the active areas. In a third method masking portions on a floating gate layer establish a pattern for partially etching the floating gate layer thereby forming the upright (vertical) part. The outer surface of the etched floating gate layer is then oxidized, and then the oxide layer is used as sidewall spacers to form STI trenches to define the individual memory cells. A disadvantage of the methods described in US20080074920 is that the methods to form inverted T shapes are complex, and require many process steps.

DISCLOSURE OF THE INVENTION

It is an aim of the present invention to present a less complex method to form a non-volatile memory structure having floating gates with an inverted T-shape on a substrate.

This aim is achieved according to the invention by a method comprising the steps of claim 1.

Thereto, the method according to the present invention comprises the following steps:
a) providing a silicon substrate,
b) providing an array of memory cells, each memory cell comprising a stack of a tunnel oxide layer on top of the substrate, and a floating gate layer on top of the tunnel oxide layer, the memory cells being self-aligned to and separated from each other by Shallow Trench Isolation (STI) structures extending into and above the substrate in height direction,
d) thinning an upper part of the floating gate layer by removing a predetermined thickness of its sidewalls, thereby creating floating gates with an inverted T shape in a cross section along the array of memory cell,
e) forming an interpoly dielectric layer on top of, and on the sides of the floating gates,
f) forming a control gate on top of the interpoly dielectric layer, the interpoly dielectric layer isolating the control gate from the floating gates,
wherein the method additionally comprises a step c) preceding step d), wherein an upper part of the sidewalls of the floating gates is exposed by partially etching back the STI structures to a height position above the tunnel oxide layer, above which height position the floating gates are to be thinned,
and wherein the step d) comprises the following steps:
i) oxidation of the exposed parts of the floating gates, thereby forming a sacrificial oxide,
j) removing the sacrificial oxide.

The inventor has discovered that a floating gate layer with an inverted T shape can be produced in a more efficient way by starting from a structure whereby the gaps between Shallow Trench Isolation (STI) structures, formed on and into a substrate, are filled with a tunnel oxide layer and a floating gate layer, then exposing an upper part of the floating gate layer by partially removing the STI structures to a first desired height, then oxidizing the exposed parts of the floating gate layer, and removing the sacrificial oxide, thereby effectively thinning the upper part of the floating gate layer.

It is an advantage of the method of the present invention that a floating gate with an inverted T shape can be made of a single piece of material, instead of a combination of a lower part and an upper part that are made in different process steps. A floating gate made of a single piece of material has better electrical and mechanical properties, by avoiding unwanted impurities between the lower and upper part of the floating gate.

By providing the floating gate material in a self-aligned way to the STI structures, a memory cell is obtained whereby the tunnel oxide and the floating gate layer are perfectly aligned to the STI structure, and whereby the STI structure can be used as a mask to deposit the tunnel oxide and the floating gate material, thus saving process steps.

By controlled oxidation of the exposed parts of the floating gate layer, the width of the upper part of the floating gate can be accurately determined by the process parameters, especially the oxidation time. An advantage of thinning by oxidation rather than by etching is that no etching damage can occur, and thus no extra steps such as using protection layers, are required to prevent etching damage. Another advantage is that oxidation of the sidewalls occurs in any direction, thus a small deviation of process parameters only has a small impact on the thickness of the upper part of the floating gate, as opposed to etching which is usually done in a direction parallel to the sidewalls, whereby thinning of the sidewalls is more difficult to control. Another advantage of oxidation over etching is that doping atoms such as Phosphor, which were present in the floating gate before the oxidation, will migrate into the floating gate material, thereby increasing the doping level and thus the conductivity of the floating gate material.

By controlling the initial height and width of the floating gate layer in step b), and the predetermined thickness of the sidewalls removed in step d), the dimensions of the inverted T shape can be accurately controlled. In addition, most of these dimensions are independent of the lithographic process used, and can thus be very accurately fine-tuned. This is particularly important for the thickness of the inverted T shape, which is the most important parameter.

In an embodiment of the method according to the present invention, in step b) optionally a hardmask is placed on top of the floating gate layer, self-aligned with the STI structures, to prevent thinning of the floating gate layer in height direction.

By providing a hardmask on top of the floating gate layer, reduction of the floating gates height can be avoided. A trade-off can be made between a method with or without using a hardmask. The method with a hardmask requiring more process steps to place and remove the hardmask, but requiring less time and material to deposit floating gate material. A hardmask can be applied in order to preserve the original height of the floating gate when thinning the upper part. Additionally a hardmask can help in controlling corner rounding effects occurring at the upper corners of the upper part of the floating gate.

In a preferred embodiment of the method according the invention, the floating gate layer is made of silicon and the STI structures are made of silicon oxide. This way the sacrificial oxide can be removed in the same step as further etching back of the STI structure.

In an alternative embodiment of the method according the invention, in step j) simultaneously with the removal of the sacrificial oxide, the STI structures are further removed to a second height above the tunnel oxide layer, to allow replacement of the further removed STI structure by interpoly dielectric. An Interpoly dielectric typically has better material properties, such as less leakage and less defects, thus providing a non-volatile memory with better data retention.

In an embodiment of the method according to the present invention, step d) optionally comprises a step k) following the step j), wherein the exposed parts of the floating gates are oxidized a second time to form a bottom layer of the interpoly dielectric layer between the floating gates and the control gate. The interpoly dielectric can be made of a single layer or multiple layers. Using oxidized floating gate material instead of deposited oxide as the bottom layer of the interpoly dielectric, results in a better quality of the interpoly dielectric and better cohesion of the interpoly dielectric layer to the floating gate layer.

BRIEF DESCRIPTION OF THE DRAWINGS

The invention will be further elucidated by means of the following description and the appended figures.

MODES FOR CARRYING OUT THE INVENTION

Figure 1:
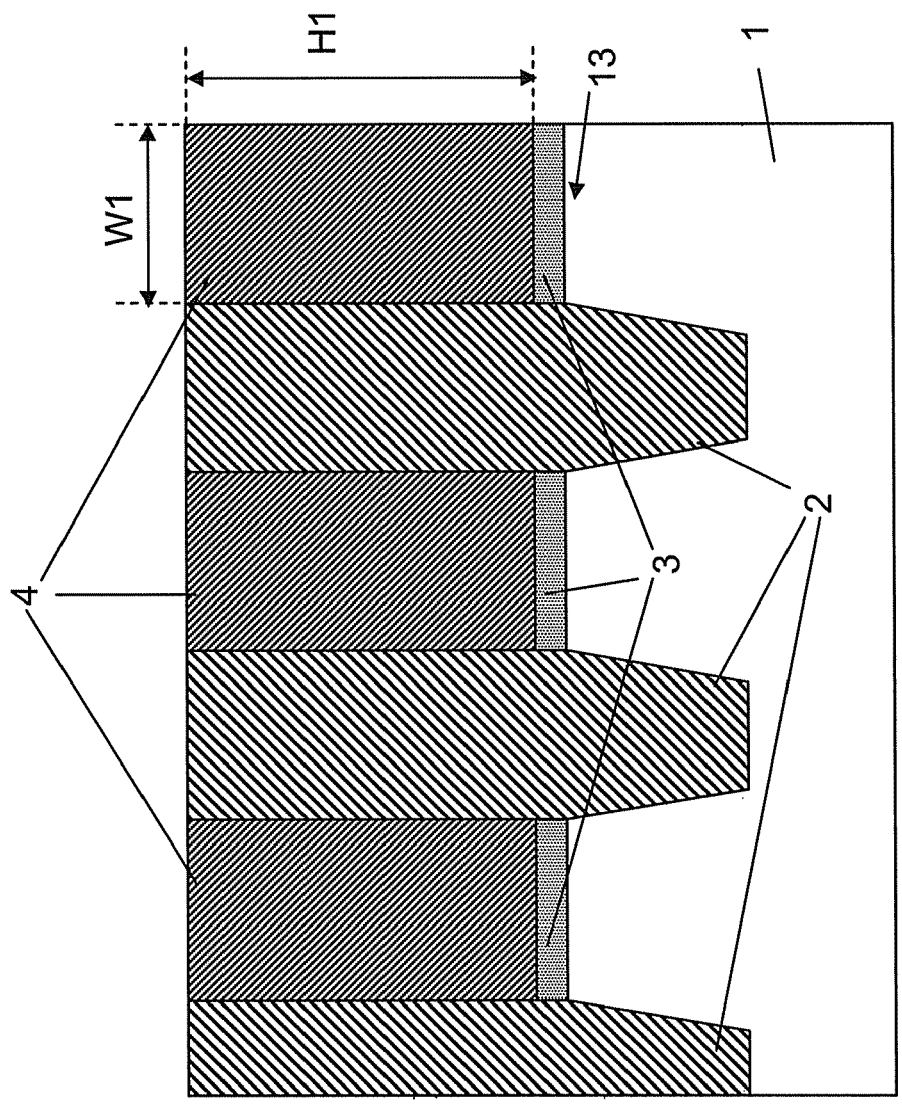
FIGS. 1-3, 4a-b, 5 are cross-sectional views of a non-volatile memory device illustrating the preferred embodiment of a first method according to the present invention, using a single oxidation step and no hard mask.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

The invention relates to a method for manufacturing a non-volatile memory comprising at least one array of memory cells on a substrate 1 of a semiconductor material, according to the preamble of the first claim.

In the drawings only a small number of memory cells are shown, for clarity of the explanation.

The method according the invention describes an improved way for manufacturing a memory device with floating gates 7 having an inverted T shape. A preferred embodiment of the method according to the present invention will be described, and variants thereof.

Example 1

Preferred Embodiment

FIGS. 1-5 are cross-sectional views of a non-volatile memory device illustrating the preferred embodiment of a method according to the present invention, whereby a floating gate 7 with an inverted T shape is made using a single oxidation step and no hardmask 10.

FIG. 1 shows a cross section of a non-volatile memory array at an early stage of fabrication. It is used as the starting structure to illustrate a first method. This starting structure can be obtained by standard processes known in the art. It can e.g. be made by starting with a silicon substrate 1, upon which a tunnel oxide layer 3 and a floating gate layer 4 are provided, through which Shallow Trench Isolation (STI) structures 2 are provided using a patterning and deposition and planarisation process. Alternatively the STI structures 2 can be provided in a silicon substrate 1 first, and then the gaps between the STI structures 2 can be filled with a tunnel oxide layer 3 and a floating gate layer 4. This structure is then planarized using conventional techniques known in the art. In both cases the tunnel oxide layer 3 and the floating gate layer 4 are self-aligned to the STI structures 2. STI structures 2 comprise a silicon oxide structure through the substrate 1 surface, extending into and above the substrate 1, thereby separating the channel regions 13 of adjacent memory cells, and the floating gate layer 4 above the substrate 1. The floating gate layer 4 of the starting structure has a height (H1) and a width (W1).

Figure 2:
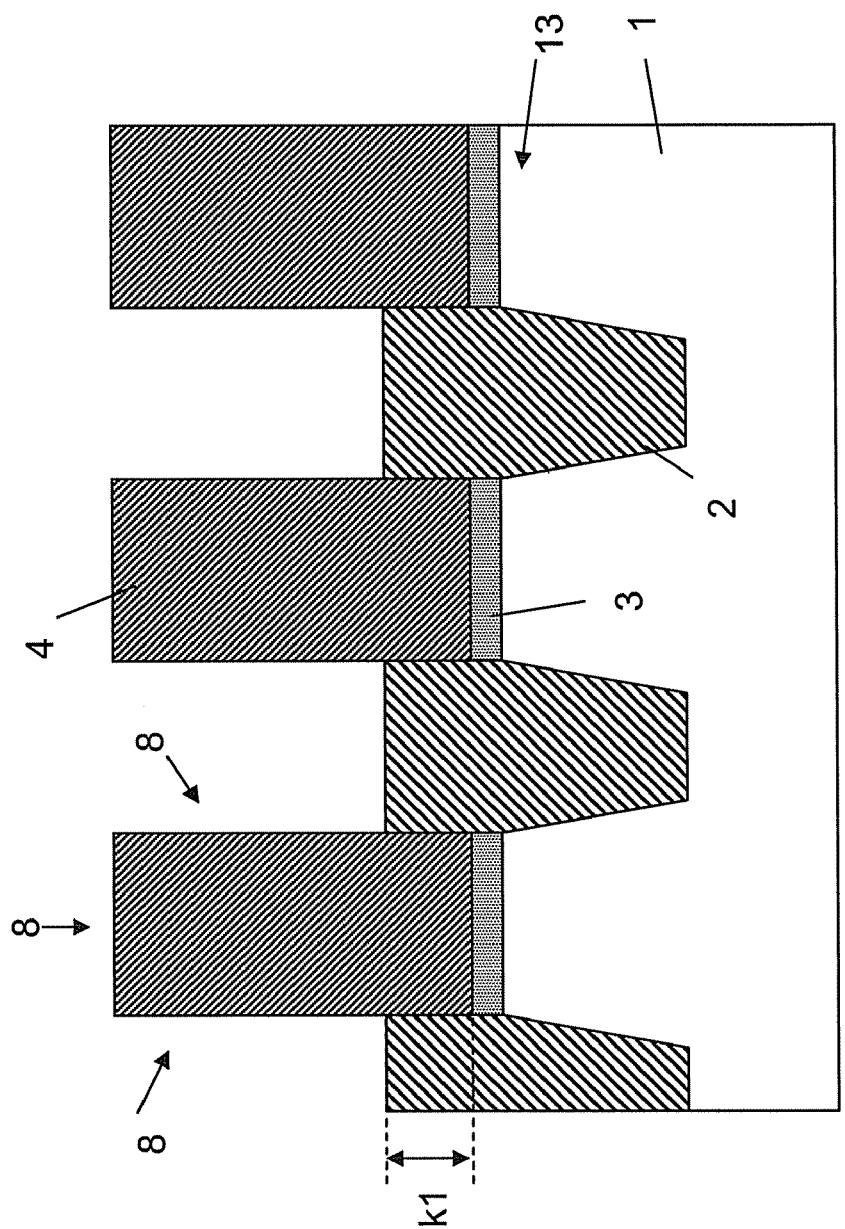

FIG. 2 shows the structure of FIG. 1 after partial etching of the STI structure 2 to a height (k1) above the tunnel oxide layer 3, thereby exposing the top and an upper part of the sidewalls of the floating gate layer 4. Above this position the floating gate layer 4 is to be thinned, and below this position the floating gate layer 4 is to keep its original width W1.

Figure 3:
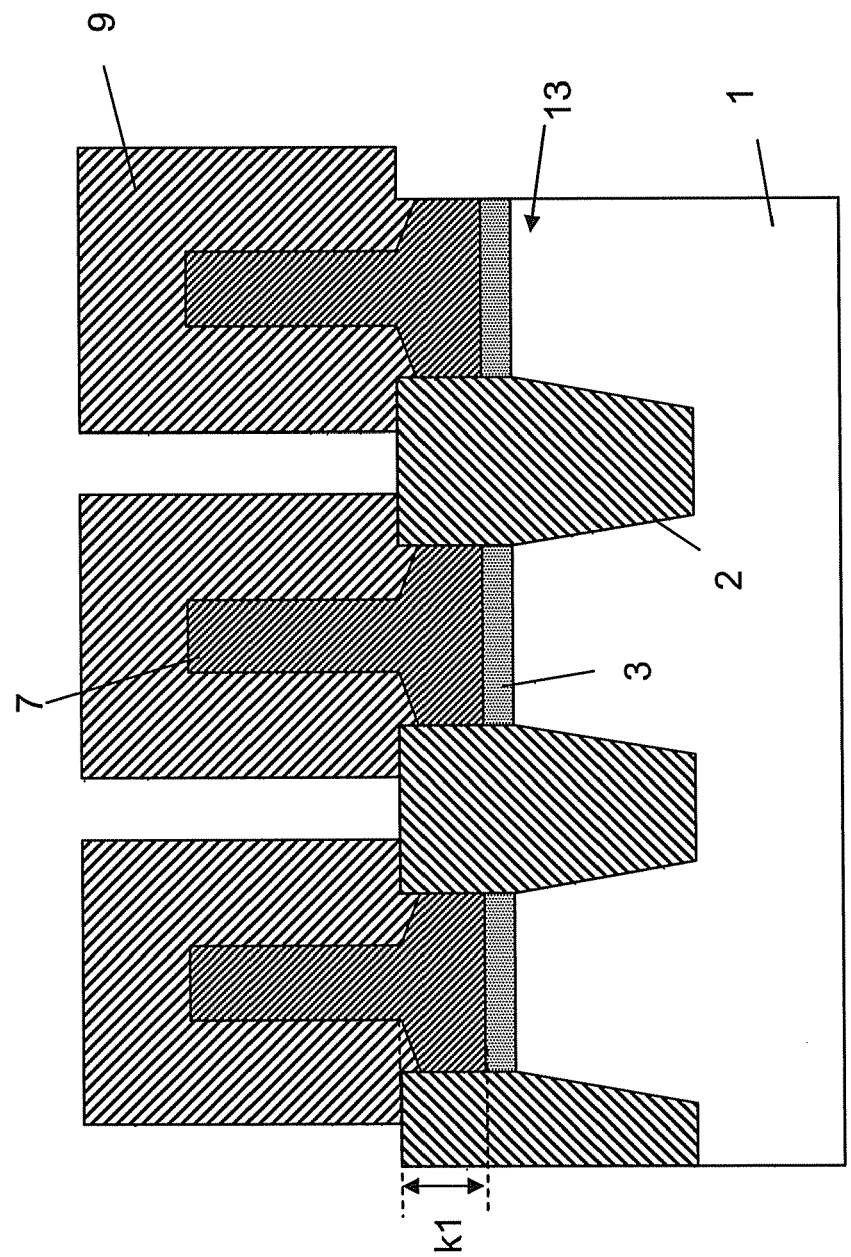

FIG. 3 shows the structure of FIG. 2 after partial oxidation, e.g. thermal oxidation, of the exposed parts 8 of the floating gates 7, whereby part of the floating gate 7 is consumed for the formation of a sacrificial oxide layer 9. An advantage of oxidation over etching is that some type of doping atoms, e.g. Phosphor, migrate into the floating gate material 7 instead of being lost into the sacrificial oxide 9. In an alternative embodiment of the method according the invention, step f) of claim 1 additionally comprises an implantation step to compensate for doping loss, e.g. Boron, during oxidation of the floating gate 7.

Figure 4A:
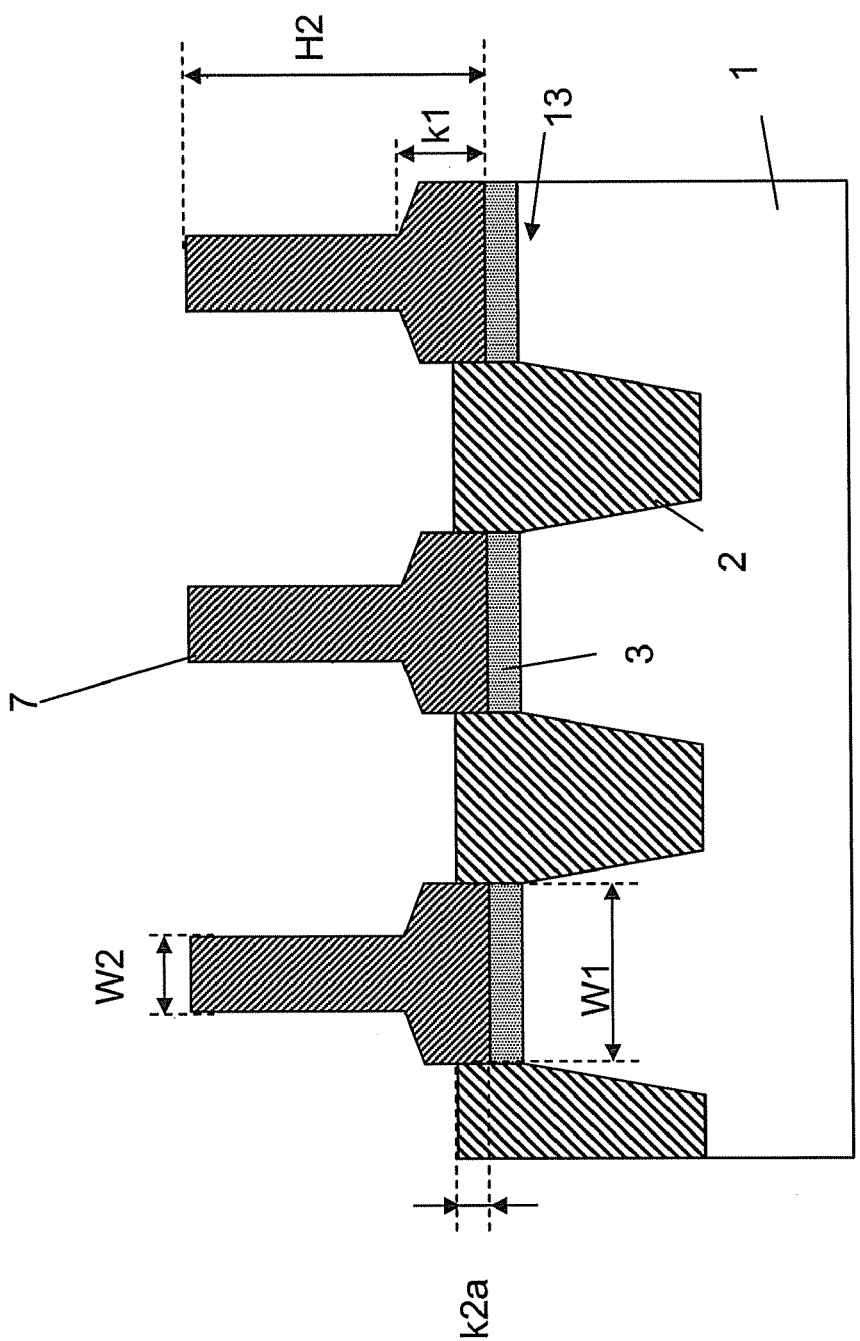
Figure 4B:
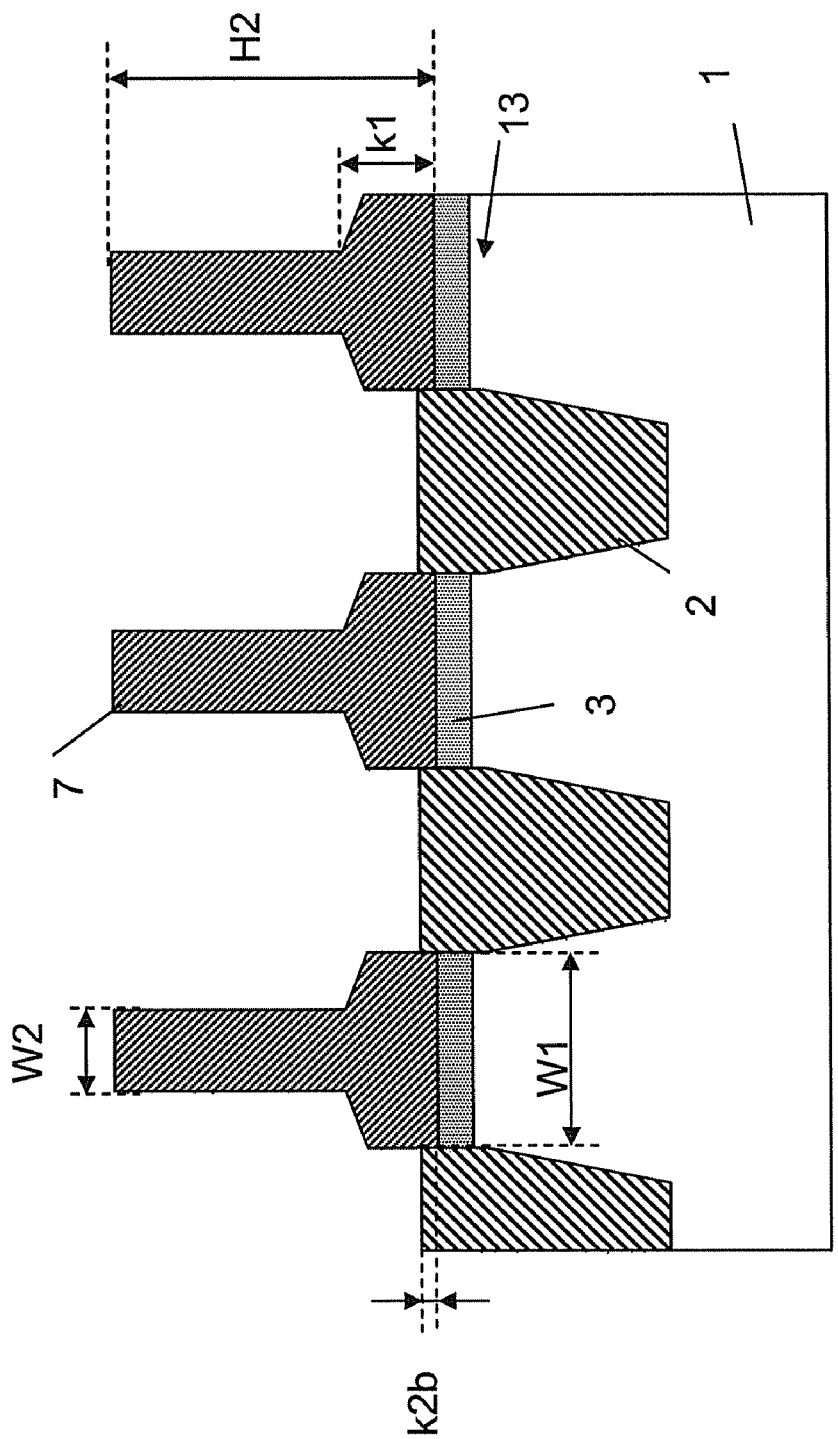

FIG. 4a shows the structure of FIG. 3 after removal of the sacrificial oxide layer 9, e;g. by wet etching, resulting in a floating gate 7 with an inverted T-shape. Note that in this first method not only the width (W1), but also the height (H1) of the original floating gate layer 4 is reduced. According to the invention, the width W2 of the upper part of the floating gate 7, also called "fin", can be controlled by controlling the initial width W1 and the oxidation conditions, e.g. the oxidation time, temperature and ambient. In this step the height of the fin is reduced to H2, and the height of the STI structure 2 above the tunnel oxide layer 3 is reduced to a height k2a. This reduction needs to be taken into account when calculating the height k1, to make sure that the tunnel oxide 3 is not exposed.

Optionally (FIG. 4b) in the same step as removing the sacrificial oxide 9, the STI structure 2 can be removed further to a height k2b above the tunnel oxide 3, e.g. by increasing the etching time, but again without exposing the tunnel oxide layer 3. This allows replacement of the further removed STI structure 2 by interpoly dielectric 5 having better material properties, such as less leakage and less defects, thus providing a non-volatile memory with better data retention.

Figure 5:
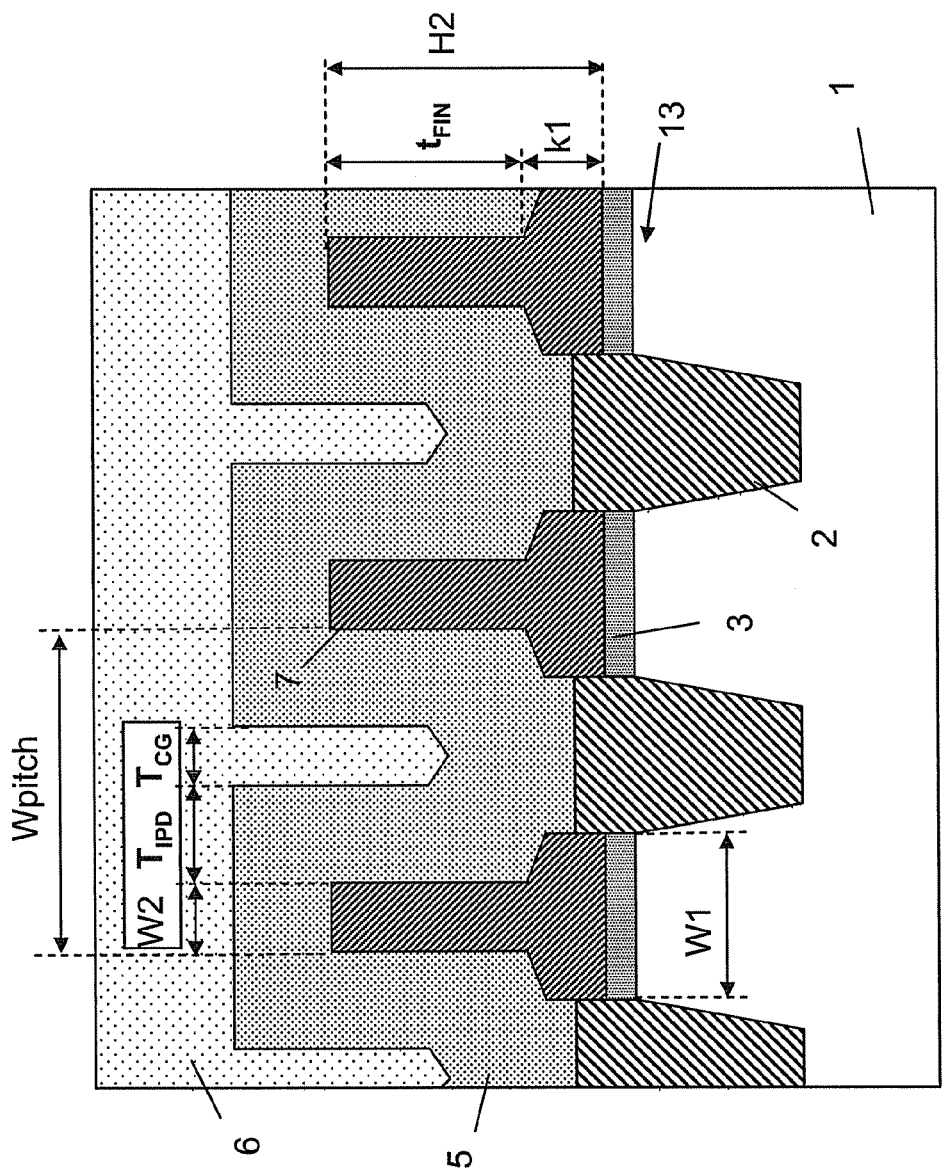

FIG. 5 shows the structure of FIG. 4 after deposition of an Interpoly dielectric (IPD) layer 5, and on top of that a control gate layer 6, electrically insulated from the floating gates 7 by the IPD layer 5.

It is preferable that the tunnel oxide 3 is made of silicon oxide through thermal oxidation process, but a insulating layer with high dielectric constant may be used also. The tunnel oxide can be also a stack of different insulating layers, e.g. a combination of lower-k and higher-k dielectrics to control the distribution of the electrical field over the tunnel oxide during tunnelling of carriers to and from the floating gate. The thickness of the tunnel oxide layer 3 is typically 2-20 nm. It is preferable that the STI structures 2 are made of silicon oxide. According to the invention, the floating gate 7 is made of a conducting or semi-conducting material that can be oxidised, e.g. polysilicon, and the sacrificial oxide layer 9 is silicon oxide. The IPD layer can e.g. by deposited by means of Atomic Layer Chemical Vapour Deposition (ALCVD). The interpoly dielectric (IPD) layer 5 can consist of a single isolating layer, e.g. a silicon oxide layer having a thickness of typically 2-20 nm, but an insulating layer with high dielectric constant may also be used. The interpoly dielectric can be also a stack of different insulating layers, e.g. a combination of lower-k and higher-k dielectrics to control the distribution of the electrical field over the tunnel oxide to prevent tunnelling of carriers to and from the control gate. The IPD layer can also consist of a combination of multiple layers, for example ONO, which consists of 3 layers: a silicon oxide ($SiO_2$) layer having a thickness of typically 3-8 nm, a silicon nitride ($Si_3N_4$) layer having a thickness of typically 5-15 nm, and a silicon oxide ($SiO_2$) layer having a thickness of typically 3-10 nm. Another example of an IPD layer made of multiple layers is the combination of a silicon oxide layer having a thickness of 2-10 nm e.g. 5 nm, and an aluminum oxide layer ($Al_2O_3$) having a thickness of 2-10 nm, e.g. 7 nm. IPD layers consisting of a combination of multiple layers are described in EP1605517, EP1903602, EP1748472, which are hereby incorporated by reference. An IPD consisting of multiple layers provides a better isolation and less leakage than a single layer. The control gate layer 6 is made of a conducting material, e.g. polysilicon, a silicide, a metallic material, or a combination thereof. The control gate 6 can e.g. be deposited by CVD such as ALCVD, LPCVD.

The dimensions (W1, W2, H2, k1) of the resulting floating gate 4 can be determined by choosing proper dimensions of the starting structure (W1, H1), and process parameters according to the invention. For example, the height H1 of the floating gate layer 4 of FIG. 1 should be determined in consideration that the top surface will be partly oxidized away.

Example 2

FIGS. 6-10 show a second method according to the present invention, which is a variant of the first method, whereby a hard mask 10 is used to prevent reduction of the height of the floating gate layer 4 during oxidation of the exposed parts 8 of the floating gate layer 4, whereby part of the floating gate layer 4 is consumed for the formation of a sacrificial oxide layer 9. As the FIGS. 6-10 are very similar to the FIGS. 1-5, only the differences will be described.

Figure 6:
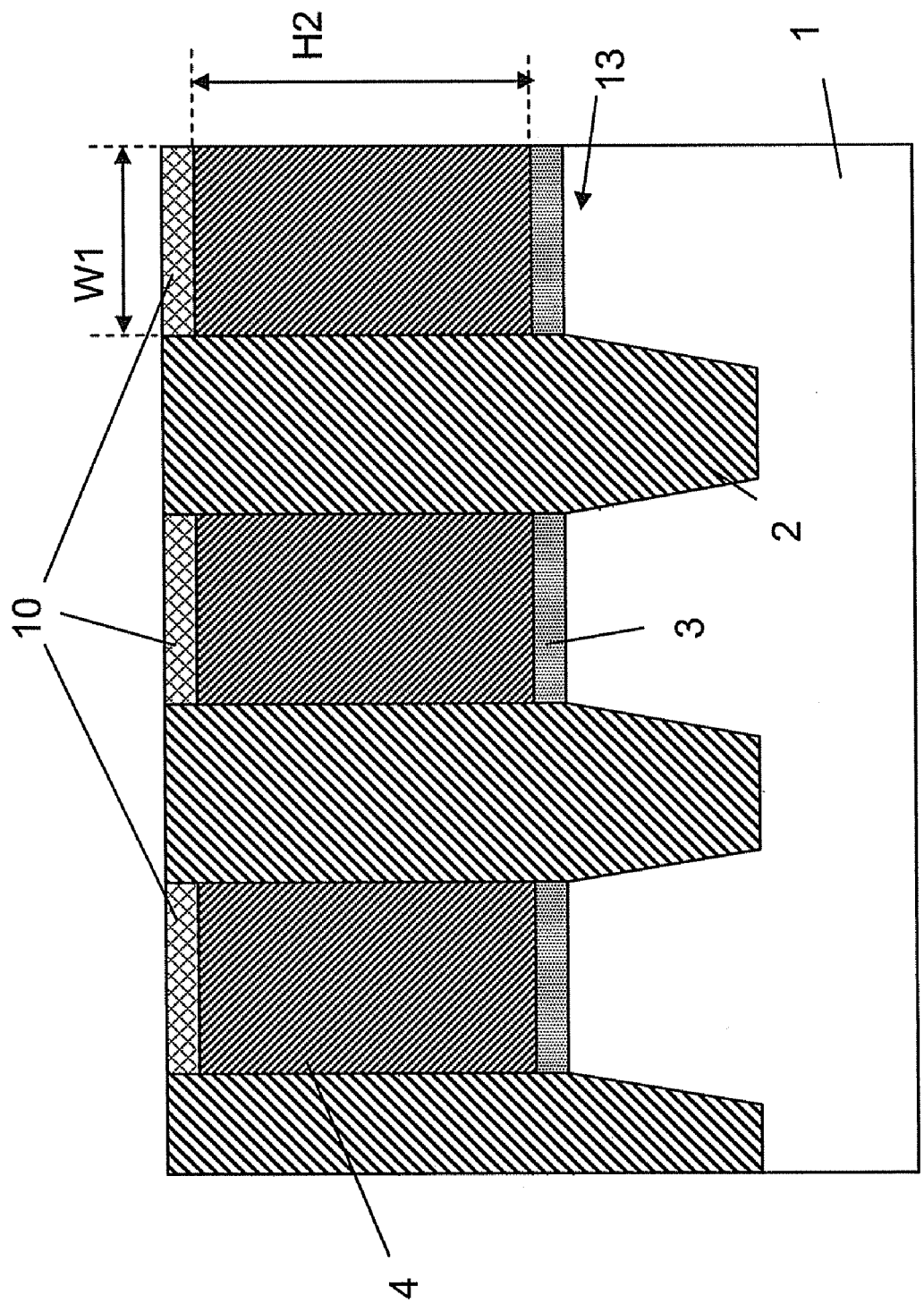
FIGS. 6-10 show a second method according to the present invention, which is a variant of the first method, using a single oxidation step and a hardmask.

FIG. 6 shows a cross section of a non-volatile memory array at an early stage of fabrication. It is used as the starting structure to illustrate a second method according to the present invention. This starting structure can be obtained by standard processes known in the art. It can e.g. be made by a similar process as described in FIG. 1, but by adding a hardmask layer 10 to the stack of a tunnel oxide layer 3 and a floating gate layer 4, self-aligned with the STI-structures.

The material of the hardmask layer 10 is typically silicon nitride ($Si_3N_4$) and is applied on top of the floating gate layer 4 using conventional techniques known in the art. To obtain floating gates 7 with the same dimensions as those shown in FIG. 5, the height (H2) of the floating gate layer 4 of the starting structure of FIG. 6 can be less than the height (H1) of the floating gate layer 4 used in FIG. 1. In fact, in this second method, the height H2 will not be reduced during the oxidation step.

Figure 7:
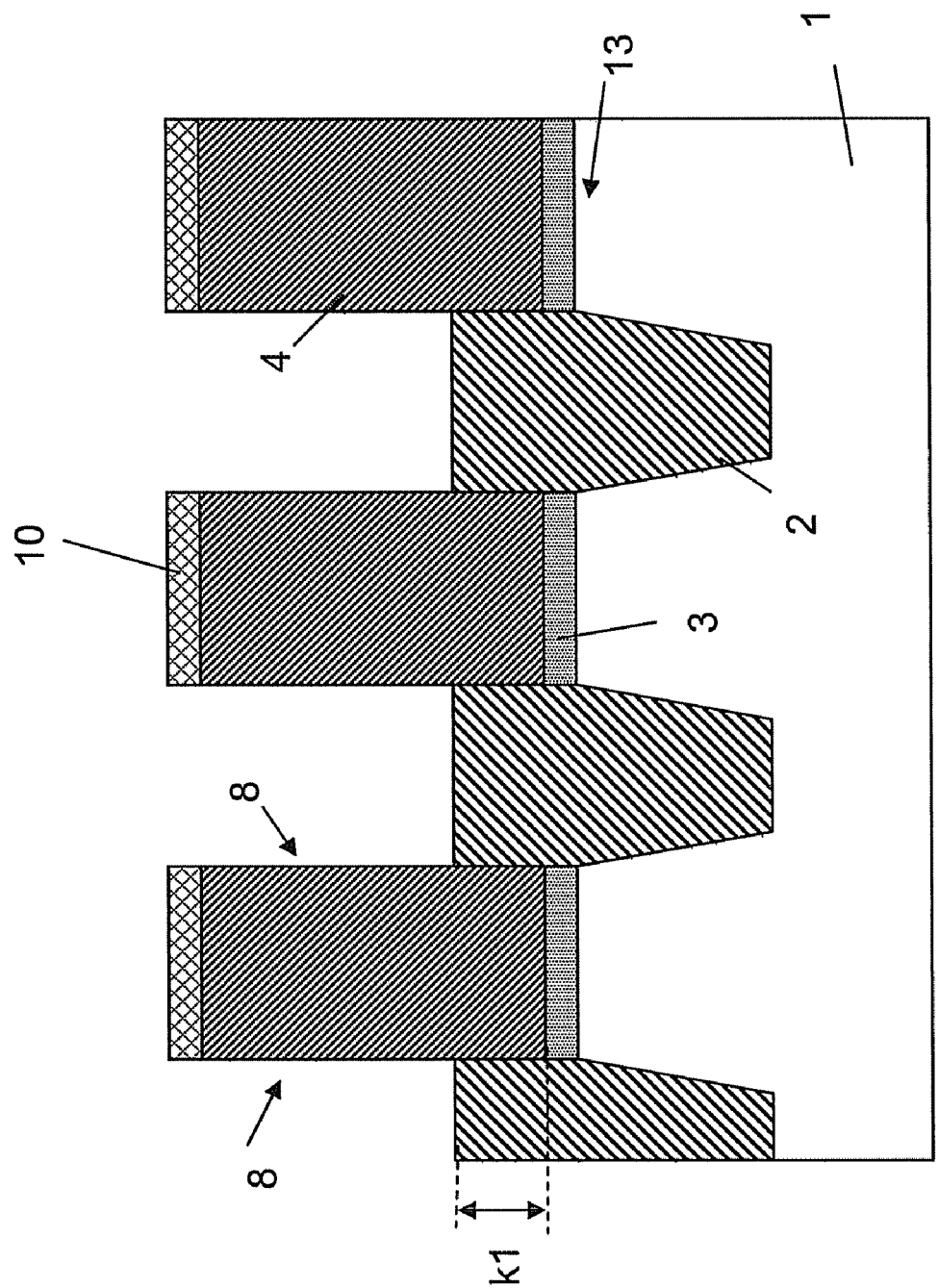

FIG. 7 shows the structure of FIG. 6 after partial etching of the STI structure 2 to a height (k1) above the tunnel oxide layer 3, thereby exposing an upper part of the sidewalls of the floating gate layer 4. Above this position the floating gate layer 4 is to be thinned in width, and below this position the floating gate layer 4 is to keep its original width W1. The difference with the first method of this invention is that the top surface of the floating gate layer 4 is not exposed due to the presence of the hardmask 10.

Figure 8:
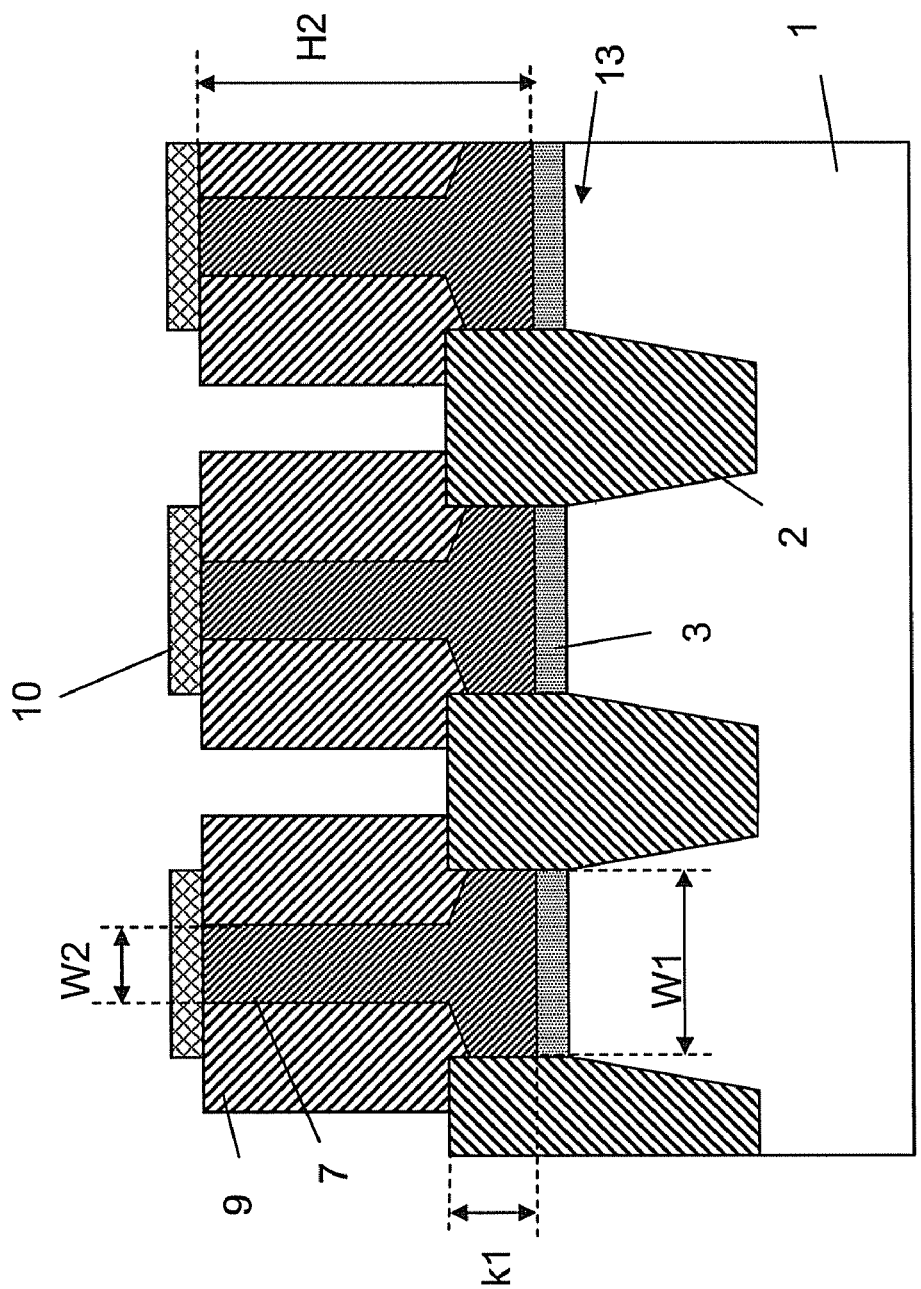

FIG. 8 shows the structure of FIG. 7 after partial oxidation of the exposed parts 8 of the floating gate layer 4, whereby part of the floating gate layer 4 is consumed for the formation of a sacrificial oxide layer 9. Note that in this second method only the width, but not the height of the original floating gate structure 4 is reduced. In this oxidation step the width of the upper part of the fin is reduced to W2.

Figure 9:
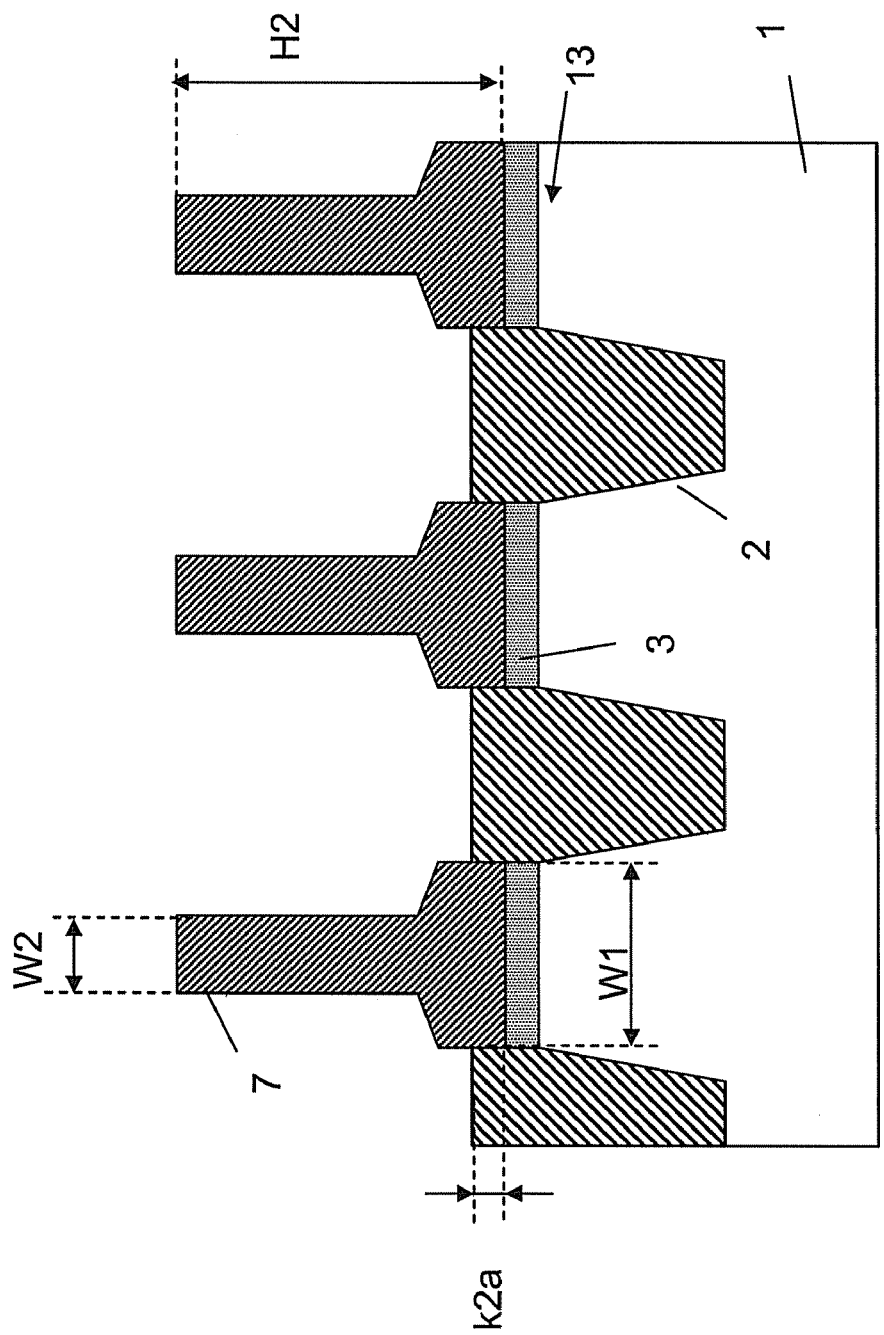

FIG. 9 shows the structure of FIG. 8 after removal of the sacrificial oxide layer 9 and the hardmask 10, resulting in a floating gate 7 with an inverted T-shape, whereby the width (W2) of the upper (upright) part is smaller than the width (W1) of the lower (horizontal) part. During the removal of the hardmask 10 and the sacrificial oxide 9, also the height of the STI structure 2 above the tunnel oxide layer 3 is reduced to a height k2a. This reduction needs to be taken into account when calculating the height k1, to make sure that the tunnel oxide 3 is not exposed.

Optionally (not shown) in the same step as removing the hardmask 10 and the sacrificial oxide 9, the STI structure 2 can be removed further to a height k2b above the tunnel oxide 3, e.g. by increasing the etching time, but again without exposing the tunnel oxide layer 3. This allows replacement of the further removed STI structure 2 by interpoly dielectric 5 having better material properties, such as less leakage and less defects, thus providing a non-volatile memory with better data retention.

Figure 10:
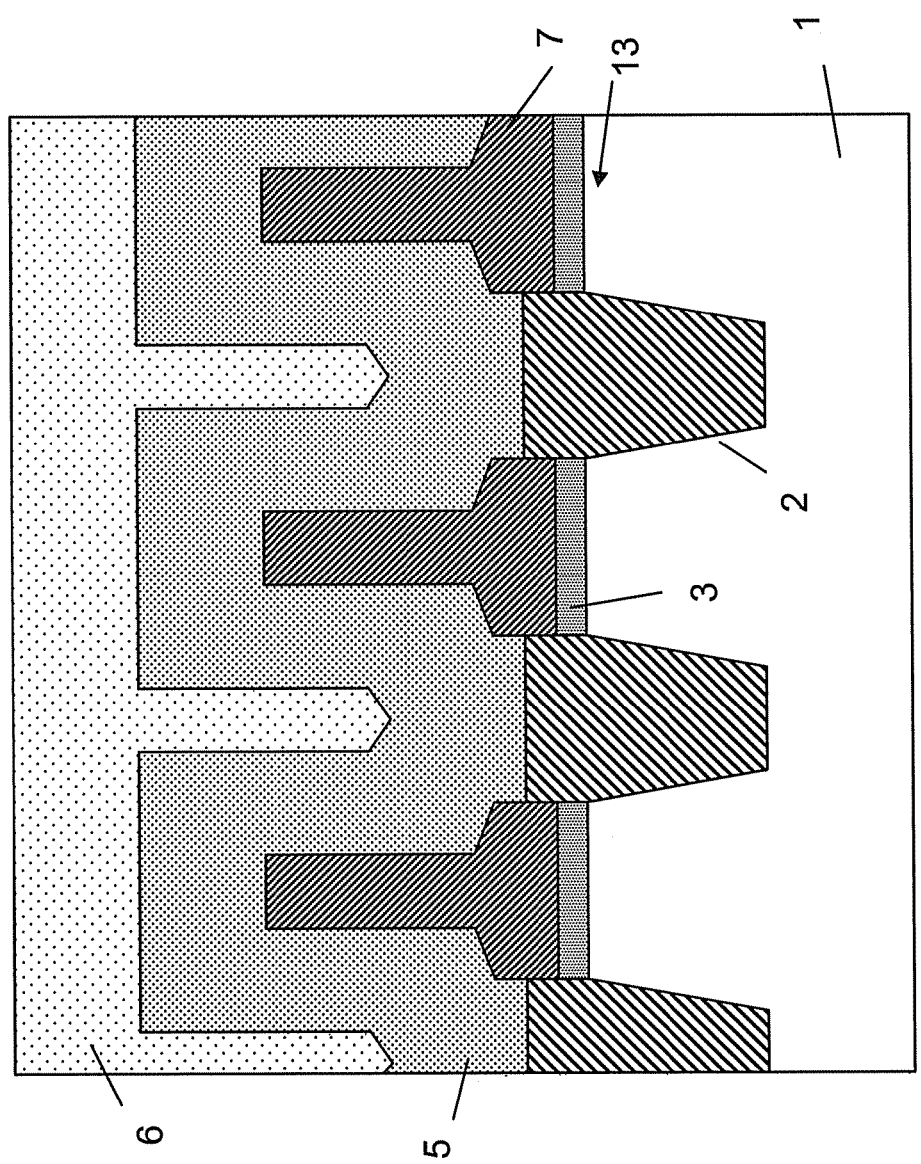

FIG. 10 shows the structure of FIG. 9 after conform deposition of an Interpoly dielectric (IPD) layer 5, and on top of that a control gate layer 6, electrically insulated from the floating gate layer 4 by the IPD layer 5.

In a variant of the second method, the hardmask is not or not entirely removed, for tuning of the corner rounding at the top of the floating gates 7. This way field strengthening at the upper corners of the fin can be counteracted.

Example 3

FIGS. 11-16 show a third method according to the present invention, which is a second variant of the first method, using two oxidation steps, wherein the sacrifical oxide 9 of the first oxidation step is removed for thinning the fin, and the oxide of the second oxidation step is used as a bottom layer of the interpoly dielectric 11 as described further.

Figure 11:
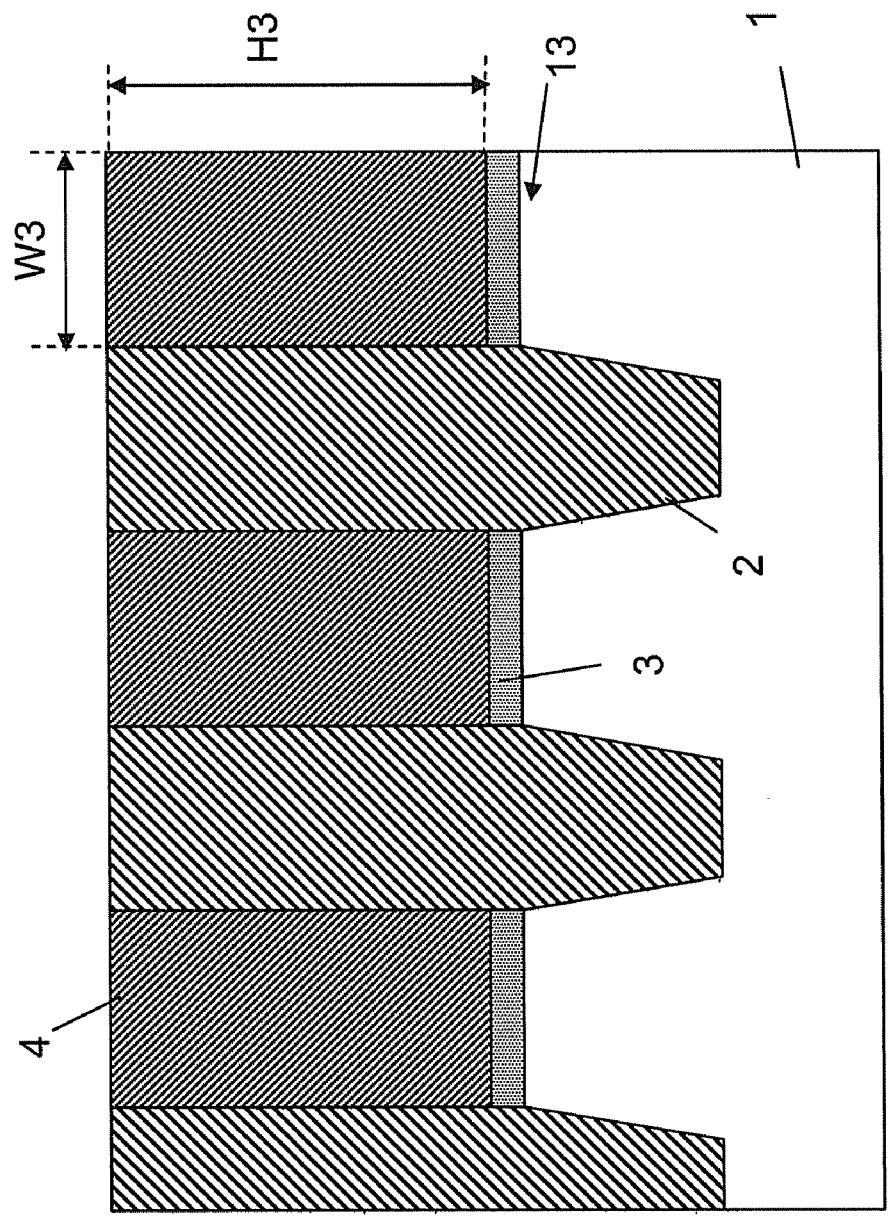
FIGS. 11-16 show a third method according to the present invention, which is a second variant of the first method, using two oxidation steps, wherein the oxide of the first oxidation step is removed, and the oxide of the second oxidation step is used as a bottom layer of the interpoly dielectric layer.

FIG. 11 shows a cross section of a non-volatile memory array at an early stage of fabrication. It is used as the starting structure to illustrate a third method according to the present invention. This starting structure can be obtained by standard processes known in the art. It can e.g. be made by a similar process as described in FIG. 1. In this case however, the height H3 and width W3 of the floating gate layer 4, need to take into account that two oxidation steps will be applied, as explained further.

Figure 12:
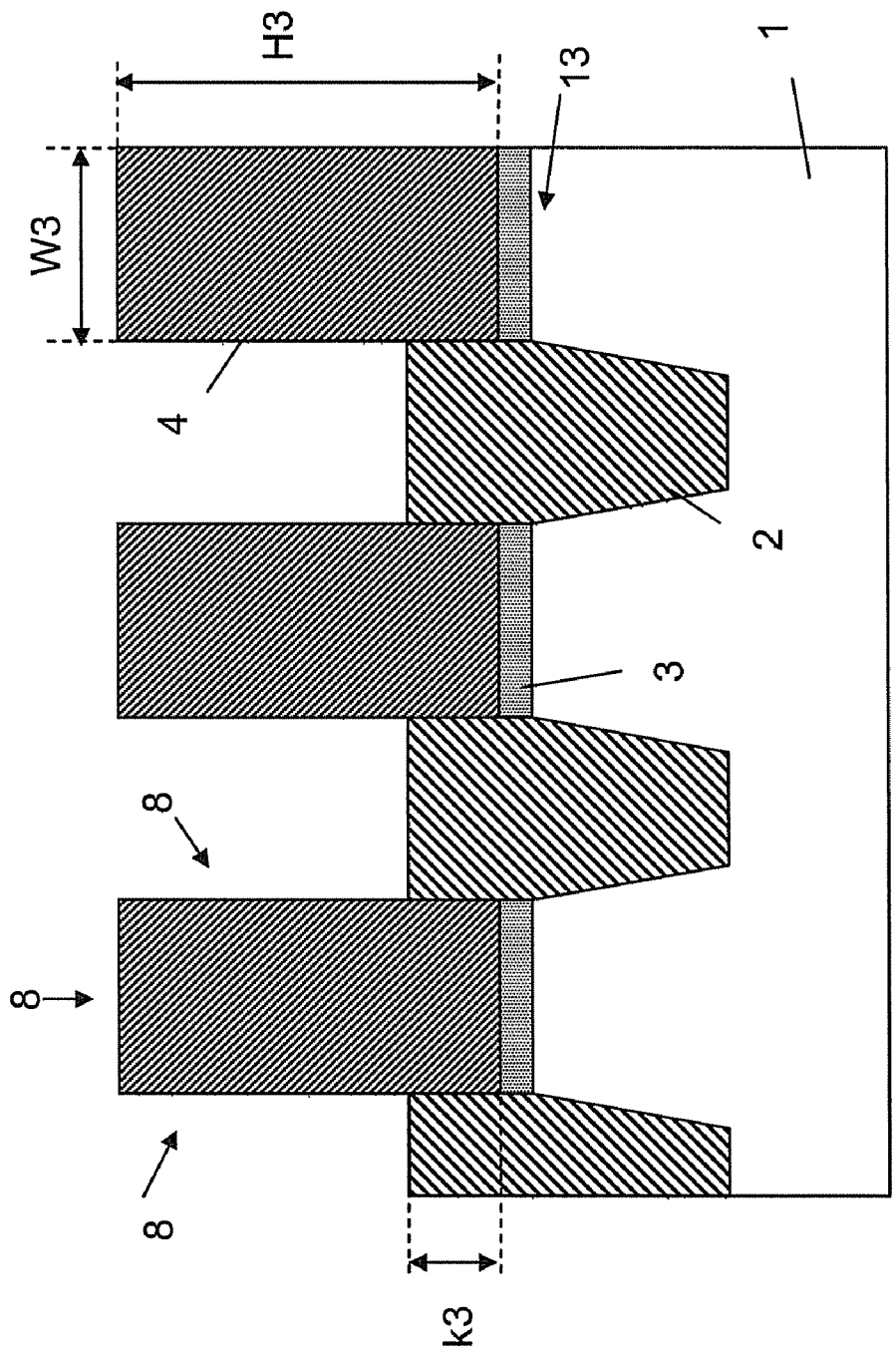

FIG. 12 shows the structure of FIG. 11 after partial etching of the STI structure 2 to a height k3 above the tunnel oxide layer 3, thereby exposing the top and an upper part of the sidewalls of the floating gate layer 4. Above this position the floating gate layer 4 is to be thinned, and below this position the floating gate layer 4 is to keep its original width W3. The predetermined height k3 needs to take into account that two oxidation steps will be applied.

Figure 13:
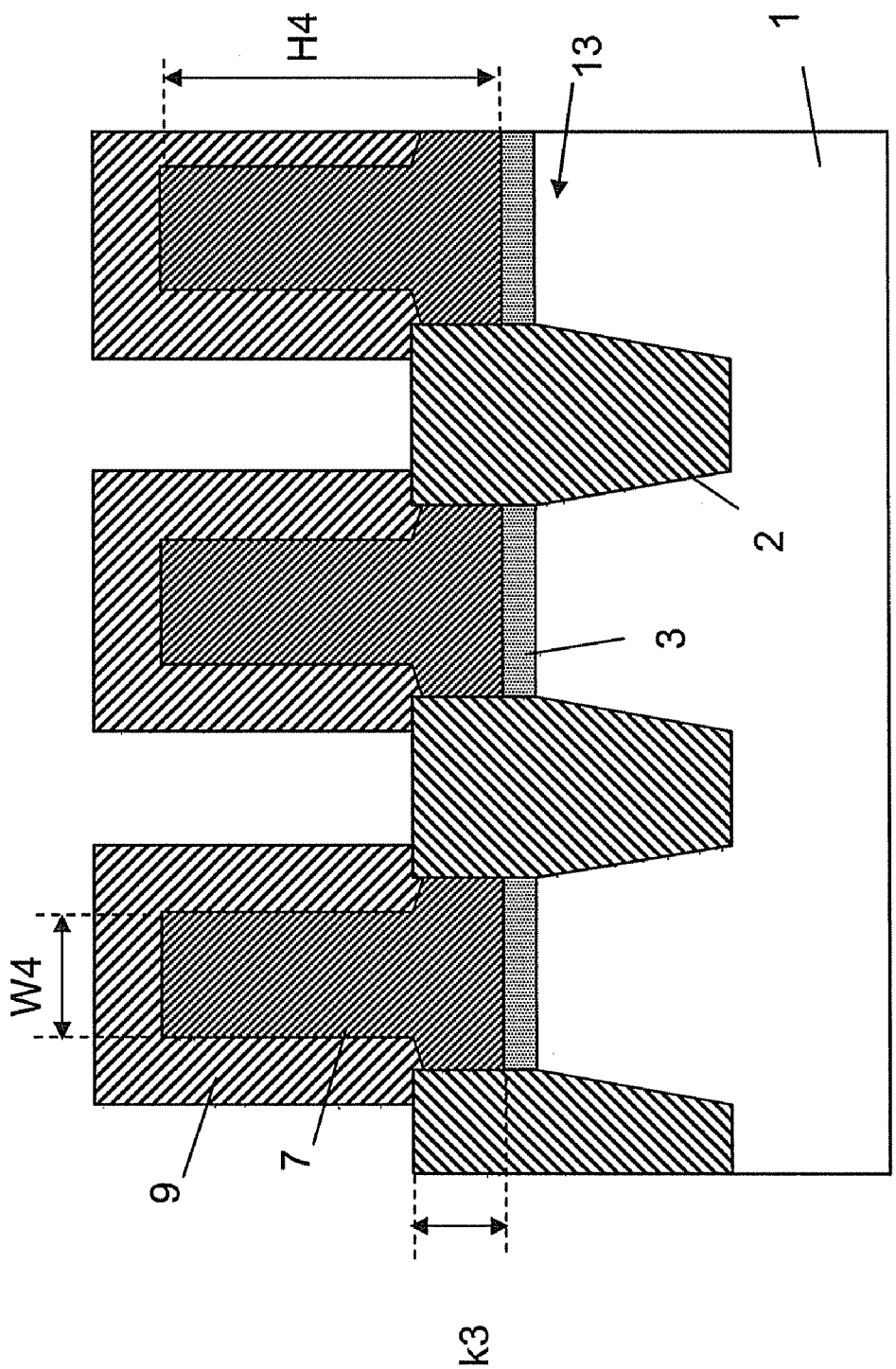

FIG. 13 shows the structure of FIG. 12 after partial oxidation, e.g. thermal oxidation, of the exposed parts 8 of the floating gate layer 4, whereby part of the floating gate layer 4 is consumed for the formation of a sacrificial oxide layer 9.

Figure 14:
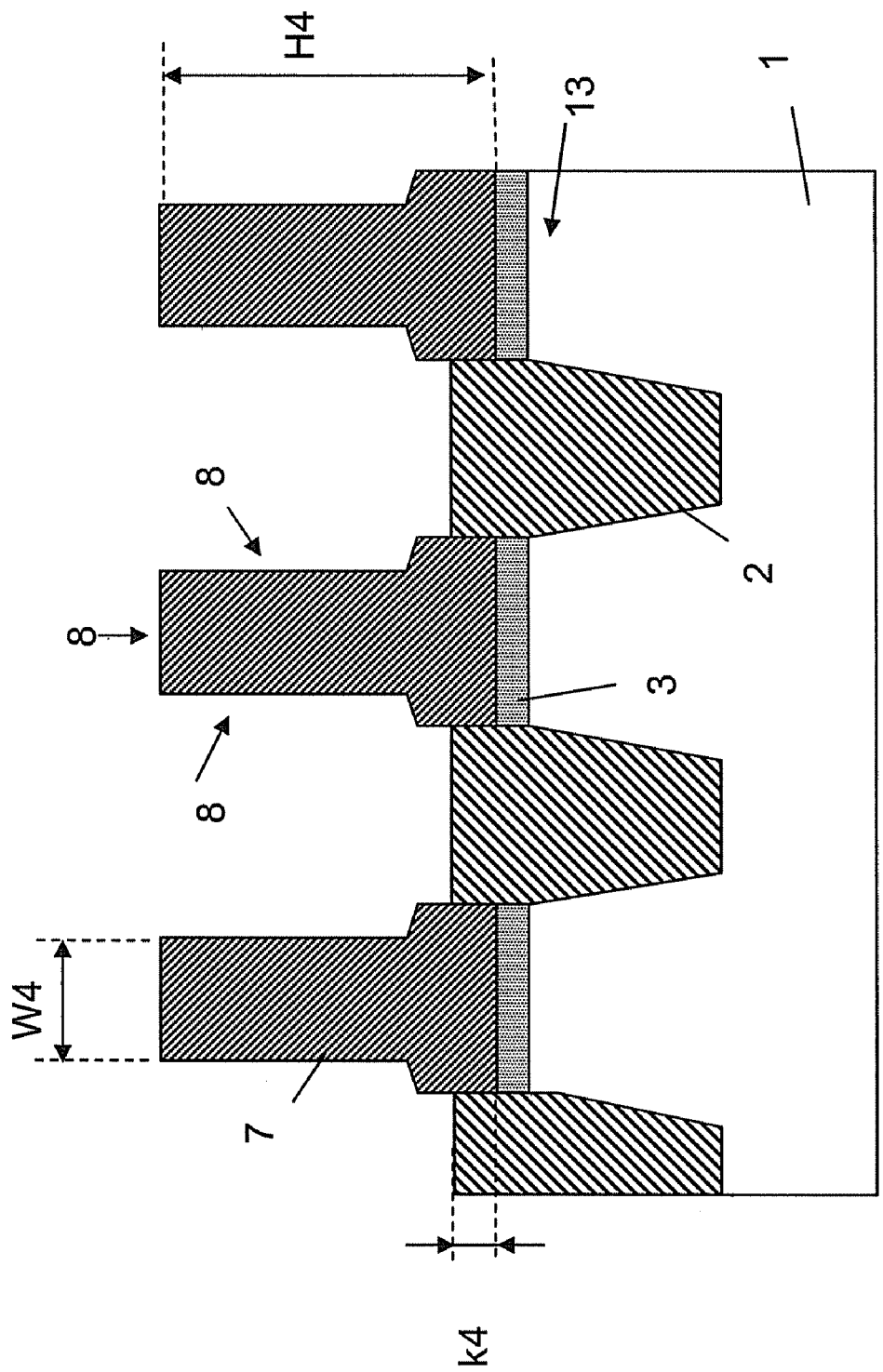

FIG. 14 shows the structure of FIG. 13 after removal of the sacrificial oxide layer 9, e.g. by etching, resulting in a floating gate 7 with an inverted T-shape. As no hardmask 10 is used on top of the floating gate layer 4, both the width and height of the floating gate layer 4 are reduced. According to the invention, the width W4 of the upper part of the floating gate 4, also called fin, can be controlled by controlling the initial width W3 and the oxidation conditions, e.g. the oxidation time. In this step the height of the fin is reduced to H4, the width to W4, and the height of the STI structure 2 above the tunnel oxide layer 3 is reduced to a height k4. This reduction needs to be taken into account when calculating the height k3, to make sure that the tunnel oxide 3 is not exposed.

Figure 15:
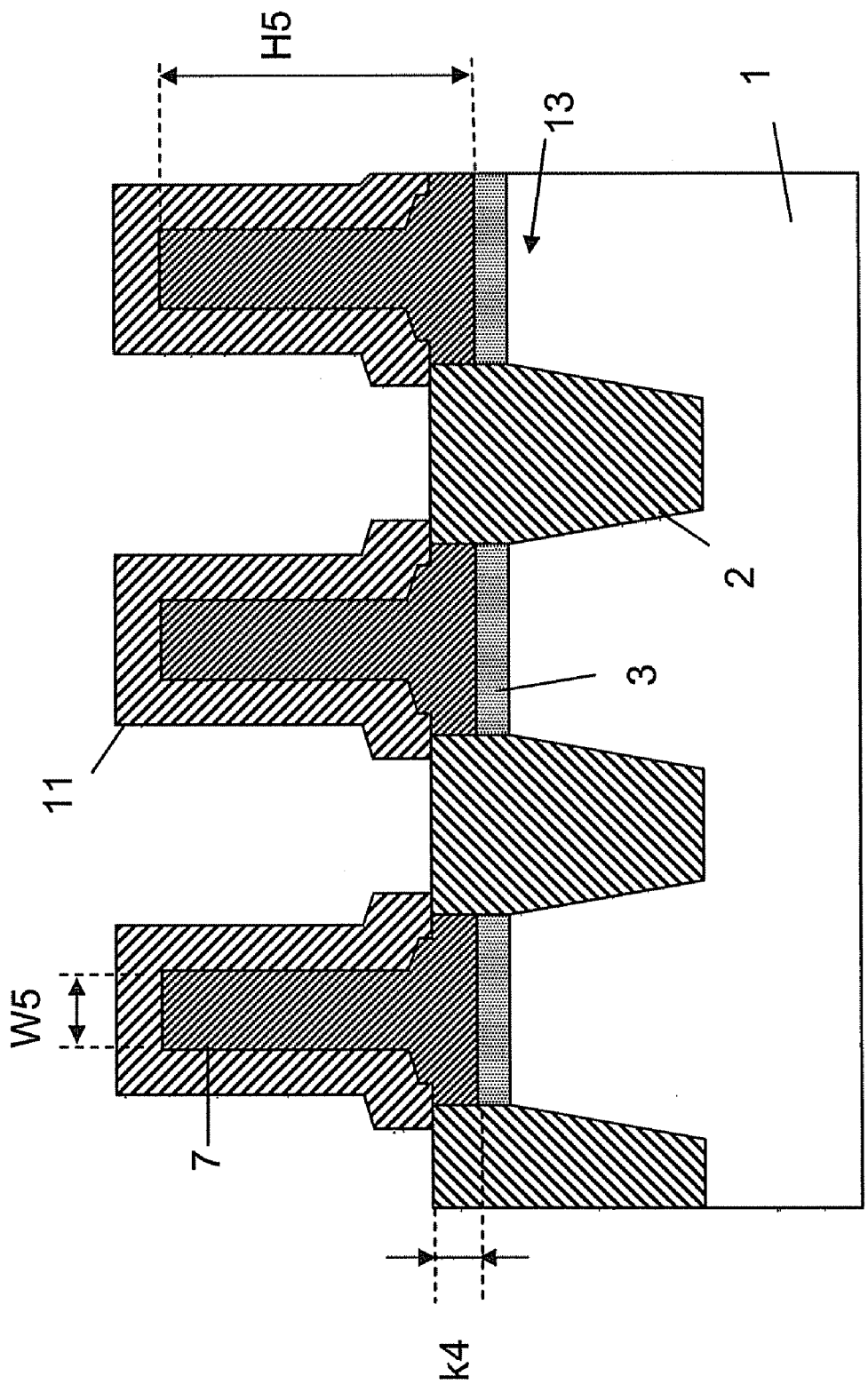

FIG. 15 shows the structure of FIG. 14 after a second oxidation of the exposed parts 8 of the floating gates 7, thereby effectively reducing the height of the fin to H5, and the width to W5. This oxide layer is not removed however, but is left on the fin to form the bottom layer of the Interpoly dielectric (IPD) layer 11 between the floating gates 7 and the control gate 6.

As described above, optionally also in this third method the predetermined height of the STI structure 2 can be reduced further.

Figure 16:
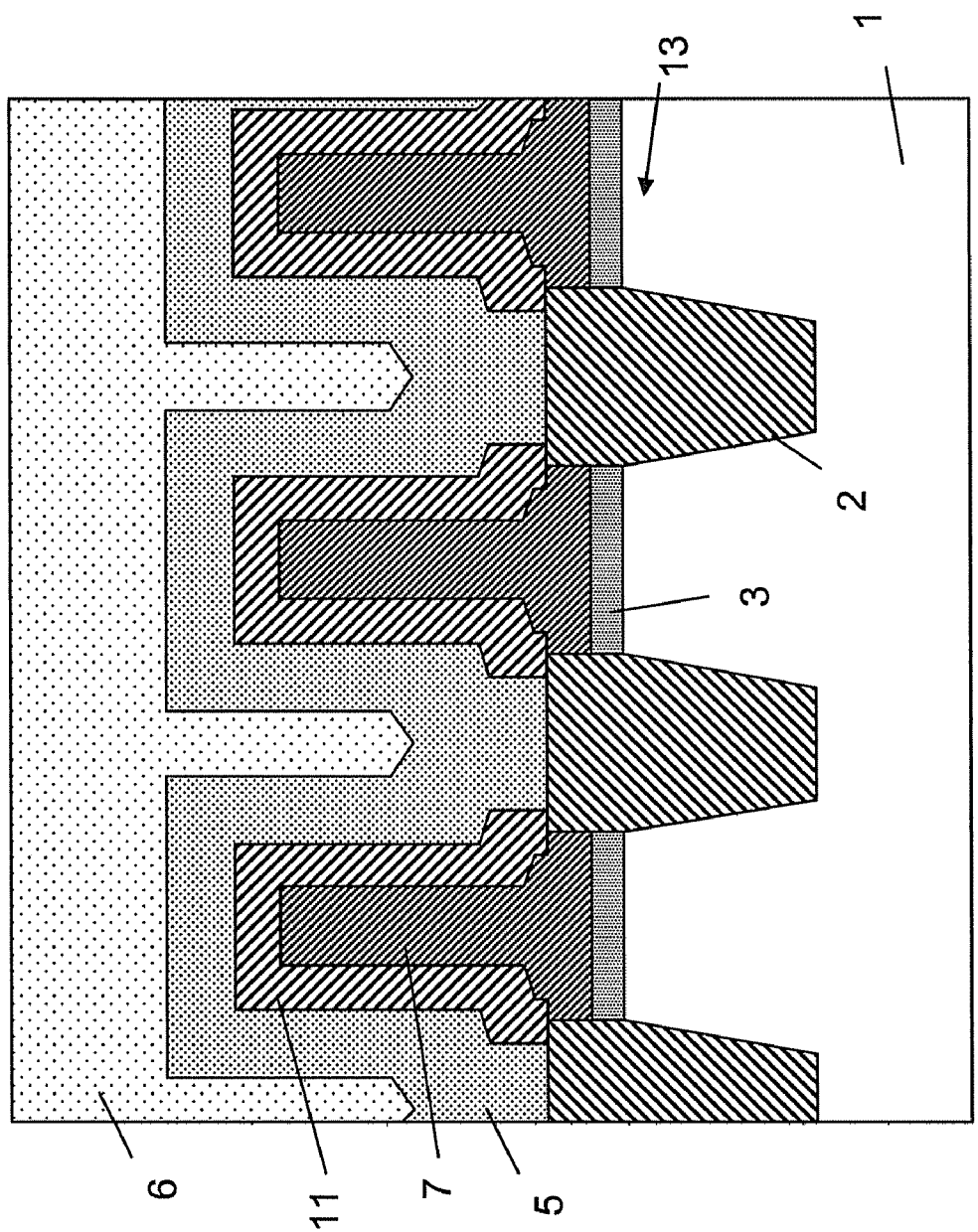

FIG. 16 shows the structure of FIG. 15 after deposition of the other layers of the interpoly dielectric layer 5 and a control gate layer 6.

Example 4

A fourth method according to the present invention is a variant of the third method, whereby a hardmask 10 is used on top of the floating gate layer 4, to prevent thinning of the floating gate layer 4 in height direction during the first oxidation step similar to the second method illustrated in Example 2. Then the hardmask 10 and the sacrificial oxide 9 are removed in a similar way as described in the second method. Then a second oxidation is performed without using the hardmask 10, whereby the second oxide is used as a bottom layer of the Interpoly dielectric oxide 11.

Figure 17:
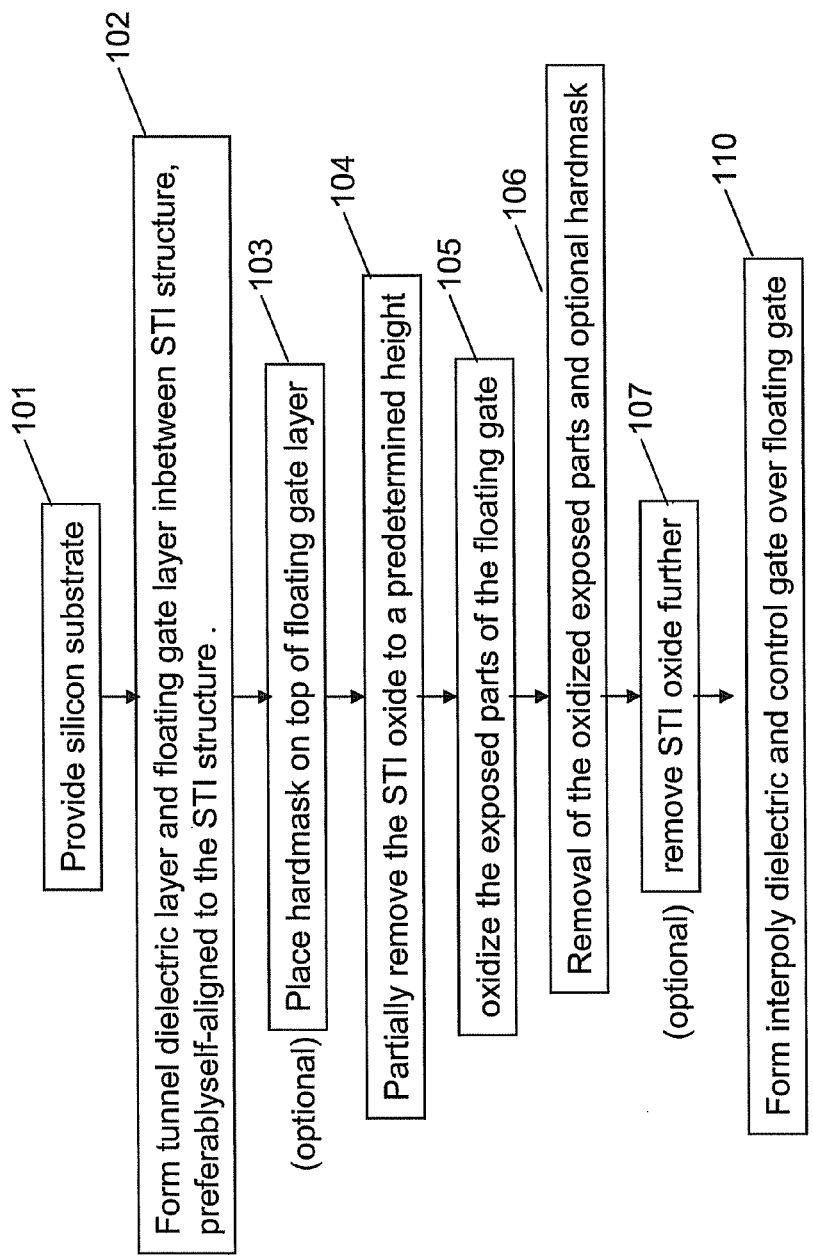
FIG. 17 shows a flowchart of the first and second method according to the present invention, corresponding to the processes of FIGS. 1-5 and FIGS. 6-10 as explained above.

FIG. 17 shows a flowchart of the first and second method, corresponding to the processes of FIGS. 1-5 and FIGS. 6-10 respectively.

Figure 18:
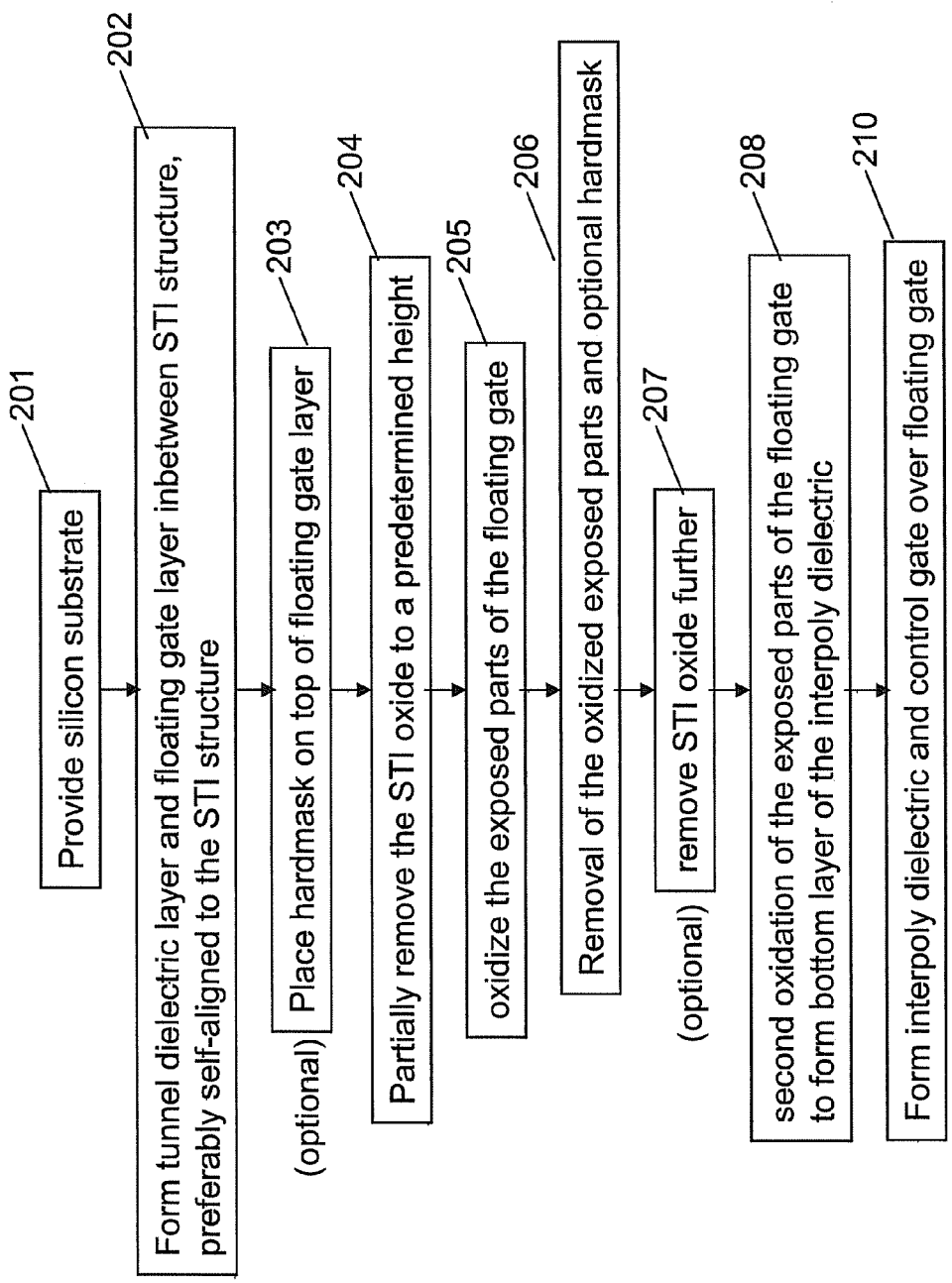
FIG. 18 shows a flowchart of the third method according to the present invention, corresponding to the processes of FIGS. 11-16 as explained above.

FIG. 18 shows a flowchart of the third and fourth method, corresponding to the processes of FIGS. 11-16 as explained above.

The oxidation of the exposed parts as described in the methods above can be done using e.g. ISSG oxide (in-situ steam generated oxidation) or wet oxidation. The oxidation parameters determine the thickness of the oxide formed on the exposed parts and hence the reduction in width W1-W2 obtained.

Table 1 below lists different ISSG recipes for forming a predetermined silicon oxide on an undoped silicon layer. If the silicon layer is doped, the oxidation rate increases, and for the given recipe a thicker oxide is formed. If e.g. the silicon layer is doped with 5e20 cm-3 P, then typically 40% more oxide is formed. Depending on the technology generation, 5 to 15 nm of the floating gate needs to be oxidized in order to obtain the desired width reduction to form the inverted T-shape.

TABLE 1 recipes for ISSG of undoped silicon

| Oxide thickness | Oxide recipe |
|---|---|
| 3 nm | t = 11.5 s; T = 850 C; P = 12.75 Torr; O2 flow = 18 slm; H2 flow = 2000 sccm |
| 5 nm | t = 53 s; T = 850 C; P = 13.5 Torr; O2 flow = 18 slm; H2 flow = 2000 sccm |
| 8.5 nm | t = 8.5 s; T = 1125 C; P = 10 Torr; O2 flow = 18 slm; H2 flow = 2000 sccm |
| 10 nm | t = 47 s, T = 1000 C, P = 7 torr, O2 flow = 12 slm, H2 flow = 6000 sccm |
| 10 nm | t = 33 s, T = 1050 C, P = 7 torr, O2 flow = 12 slm, H2 flow = 6000 sccm |
| 10 nm | t = 25 s, T = 1100 C, P = 7 torr, O2 flow = 12 slm, H2 flow = 6000 sccm |
| 10 nm | t = 18 s; T = 1150 C; P = 7 Torr; O2 flow = 12 slm, H2 flow = 6000 sccm |

Table 2 below lists different wet oxidation recipes for forming a predetermined silicon oxide on an undoped silicon layer. If the silicon layer is doped, the oxidation rate increases, and for the given recipe a thicker oxide is formed. If e.g. the silicon layer is doped with 5e20 cm-3 P, then typically 40% more oxide is formed. Depending on the technology generation, 5 to 15 nm of the floating gate needs to be oxidized in order to obtain the desired width reduction to form the inverted T-shape.

TABLE 2 recipes for wet oxidation of undoped silicon

| Oxide thickness | Oxide recipe |
|---|---|
| 5 nm | t = 11.5 min; T = 750 C; atmospheric pressure; O2 flow = 4.2 slm; H2 flow = 4.2 slm |
| 10 nm | t = 34.5 min; T = 750 C; atmospheric pressure; O2 flow = 4.2 slm; H2 flow = 4.2 slm |

The dimensions of the inverted T-shape floating gate can be determined as followed, whereby in FIG. 5 the additional dimensional parameters are illustrated.

The coupling ratio CR of the control gate 4 to the channel 13 can be expressed as:

$$CR = C_{IPD}/(C_{IPD} + C_{TD}) \quad (1)$$

with CR being the coupling ratio, $C_{IPD}$ being the capacity between the control gate 6 and the floating gate 4, $C_{TD}$ being the capacity between the floating gate 4 and the channel 13. Typically the coupling ratio CR is equal to or larger than 0.6. Hence the ratio $C_{IPD}/C_{TD}$ is equal to or greater than 1.5 or $C_{IPD}$ is equal to or greater than $1.5*C_{TD}$.

In a first order approximation one can define the capacitances as follows $$C_{TD} = W1*L*\text{epsilon}_{ox}/EOT_{TD} \quad (2)$$

$$C_{IPD} = (W2 + 2 \cdot t_{FIN})*L*\text{epsilon}_{ox}/EOT_{IPD} \quad (3)$$

with W1 the width of the memory cell, L the length of the memory cell, W2 is the width of the fin, i.e. the upper part of the floating gate, $t_{FIN}$=H2−k1 is the height of the fin, $EOT_{TD}$ is the equivalent electrical oxide thickness of the tunnel dielectric 3, $EOT_{IPD}$ is the equivalent electrical oxide thickness of the IPD dielectric 5 which is typically in the range of 7-9 nm, $\text{epsilon}_{ox}$ is the relative dielectric constant of SiO2 ($\text{epsilon}_{ox}$=3.9*epsilon$_0$ with epsilon0 being the absolute dielectric constant of vacuum). It is assumed that silicon oxide is used a dielectric material to form the tunnel dielectric 3 and the interpoly dielectric 5. As stated above these two dielectrics 3 and 5 can be formed as a stack of layers of materials with different dielectric properties in which case of course the combination of thickness and dielectric constant of the respective layers is to be used in formulas (2) and (3). The minimal values of W1 and L depend on the technology generation. In case of a 32 nm technology, W1=L=32 nm as 32 nm is the minimal feature size targeted at in this technology.

Apart from having the desired coupling ratio CR, the memory cell must of course fit in the pitch along the W direction X. One can define the following ratio:

$$W2 + 2*T_{IPD} + T_{CG} = W\text{pitch} \quad (4)$$

with Wpitch being the pitch in the W direction, typically Wpitch=2*W1=2*feature size of the technology generation, $T_{IPD}$ being the physical thickness of the IPD dielectric 5, $T_{CG}$ being the minimal physical thickness of the control gate. In case of a 15 nm technology generation, Wpitch=15*2=30 nm, W2=$T_{CG}$=5 nm and $T_{IPD}$=10 nm as formed by a stack of 4 nmSiO2/6 nmAl2O3. More relaxed dimensions are Wpitch=20 nm*2=40 nm, W2=$T_{CG}$=6 nm, $T_{IPD}$=14 nm.

When determining the dimensions of the inverted T-shape floating gate memory cell, other electrical, physical and process considerations must be taken into account:

The width W2 of the fin is limited by conductivity as a too small fin can suffer from complete depletion, by wafer uniformity and by mechanical stability as a too small fin might collapse.

When etching the control gate 6, the complete stack of control gate 6, interpoly dielectric 5, floating gate 7 and tunnel dielectric 3 must be etched. Hence the thickness H2 of the floating gate 7 determines the thickness of the control gate 5 to be etched as the control gate 5 envelopes the floating gate 7 and fills the gaps in between adjacent control gates 7 as illustrated in FIG. 5.

Figure 19A:
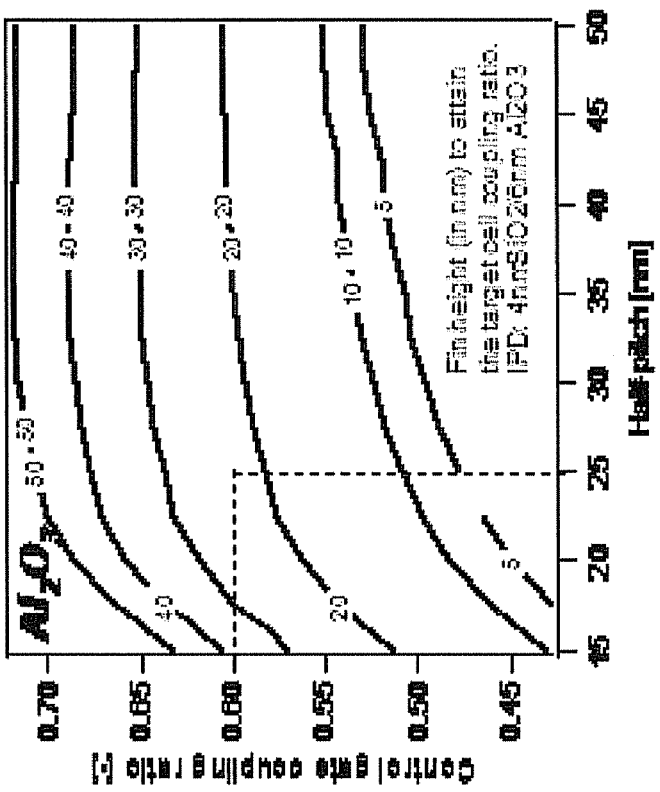
FIGS. 19a-b shows the control gate coupling ratio CR as function of the half pitch Wpitch/2 for various values of the height $t_{FIN}$ of the floating gate for (a) a 4 nm SiO2/4 nm Si3Ni4/4 nm SiO2 ONO stack and (b) a 4 nm SiO2/6 nm Al2O3.
Figure 19B:
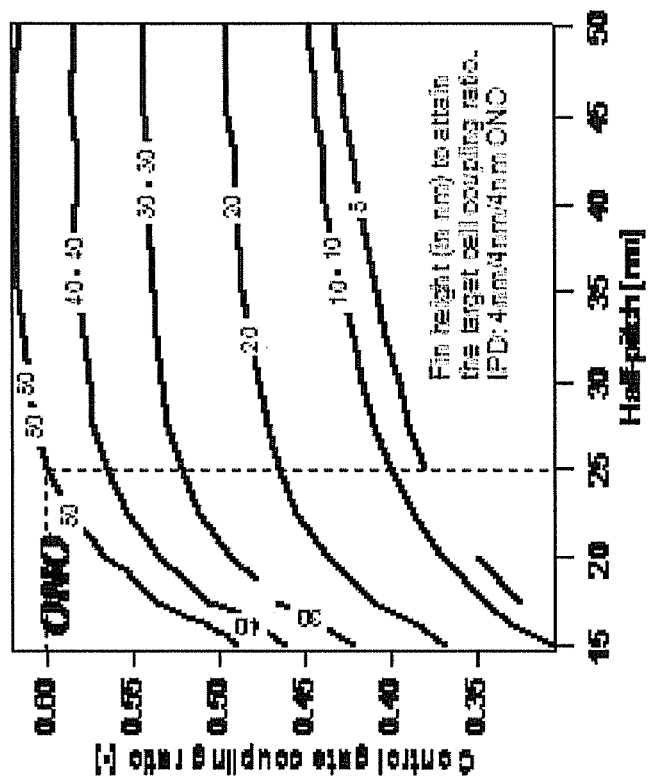

The thickness $T_{IPD}$ and composition of the interpoly dielectric 5 is selected in order to reduce leakage between the control gate 6 and the floating gate 7. An example of such an interpoly dielectric 5 is a stack of SiO2 AND Al2O3 whereby the thickness of SiO2 is about 4 to 5 nm while the thickness of the Al2O3 is about 6 to 10 nm resulting in a physical thickness is about 11 to 15 nm For a more accurate determination of the coupling ratio CR the 3D structure of the memory cell is to be taking into account. One can use simulation data as represented in FIGS. 19a and 19b. These figures shows for an interpoly dielectric 5 configured as (a) a 4 nm SiO2/4 nm Si3Ni4/4 nm SiO2 ONO stack or (b) a 4 nm SiO2/6 nm Al2O3 stack the coupling ratio CR as function of the half pitch Wpitch/2 (=W1) for various values of the height $t_{FIN}$ of (the upper part of) the floating gate 7. For a given pitch of e.g. 25 nm, one will for the 4 nm SiO2/6 nm Al2O3 interpoly dielectric stack 5 have to select a $t_{FIN}$ of about 25 nm to have a CR of 0.6, (see FIG. 19B, dotted lines). If an ONO stack is used, then the dimensions of the floating gate 7 must increase considerably, in order to obtain the same pitch with comparable CR.

The invention claimed is:

1. A method of manufacturing a non-volatile memory, the method comprising:
  providing a semiconductor substrate;
  forming in the semiconductor substrate at least one Shallow Trench Isolation (STI) structure that extends into and above the semiconductor substrate in a height direction;
  forming on the semiconductor substrate an array of memory cells, each memory cell comprising a tunnel oxide layer formed on the semiconductor substrate, and a floating gate layer formed on the tunnel oxide layer, wherein adjacent memory cells in the array of memory cells are separated from one another by the at least one STI structure;

partially etching back the at least one STI structure to expose an upper portion of the floating gate layer of each memory cell, wherein the exposed upper portion of each floating gate layer forms a fin with an exposed top and exposed sidewalls;

oxidizing the exposed sidewalls of each fin;

removing a first oxidized layer, thereby reducing the width of each fin, and forming an inverted-T floating gate from each floating gate layer; and oxidizing the exposed top of each fin, wherein removing the first oxidized layer additionally reduces the height of each fin.

2. The method of claim 1, further comprising further etching the at least one STI structure.

3. The method of claim 1, wherein the at least one STI structure comprises silicon oxide ($SiO_2$).

4. The method of claim 1, wherein the at least one STI structure is formed in the semiconductor substrate prior to the array of the memory cells.

5. The method of claim 1, wherein the at least one STI structure separates channel regions of adjacent memory cells in the array of memory cells.

6. The method of claim 1, wherein oxidizing the exposed sidewalls of each fin comprises oxidizing the exposed sidewalls of each fin through thermal oxidation.

7. The method of claim 1, wherein removing the first oxidized layer comprises removing the first oxidized layer through wet etching.

8. The method of claim 1, further comprising:
forming an interpoly dielectric (IPD) layer over each inverted-T floating gate; and
forming a control gate over the IPD layer.

9. A method of manufacturing a non-volatile memory, the method comprising:
providing a semiconductor substrate;
forming in the semiconductor substrate at least one Shallow Trench Isolation (STI) structure that extends into and above the semiconductor substrate in a height direction;
forming on the semiconductor substrate an array of memory cells, each memory cell comprising a tunnel oxide layer formed on the semiconductor substrate, and a floating gate layer formed on the tunnel oxide layer, wherein adjacent memory cells in the array of memory cells are separated from one another by the at least one STI structure;
partially etching back the at least one STI structure to expose an upper portion of the floating gate layer of each memory cell, wherein the exposed upper portion of each floating gate layer forms a fin with an exposed top and exposed sidewalls;
oxidizing the exposed sidewalls of each fin;
removing a first oxidized layer, thereby reducing the width of each fin, and forming an inverted-T floating gate from each floating gate layer; and
implanting dopants to compensate for doping loss during oxidation.

10. A method of manufacturing a non-volatile memory, the method comprising:
providing a semiconductor substrate;
forming in the semiconductor substrate at least one Shallow Trench Isolation (STI) structure that extends into and above the semiconductor substrate in a height direction;
forming on the semiconductor substrate an array of memory cells, each memory cell comprising a tunnel oxide layer formed on the semiconductor substrate, and a floating gate layer formed on the tunnel oxide layer, wherein adjacent memory cells in the array of memory cells are separated from one another by the at least one STI structure;
partially etching back the at least one STI structure to expose an upper portion of the floating gate layer of each memory cell, wherein the exposed upper portion of each floating gate layer forms a fin with an exposed top and exposed sidewalls;
oxidizing the exposed sidewalls of each fin;
removing a first oxidized layer, thereby reducing the width of each fin, and forming an inverted-T floating gate from each floating gate layer;
further oxidizing the exposed sidewalls of each fin; and
removing a second oxidized layer, thereby further reducing the width of each fin.

11. The method of claim 10, further comprising:
forming an Interpoly dielectric (IPD) layer over each inverted-T floating gate, wherein the IPD layer comprises the second oxidized layer; and
forming a control gate over the IPD layer.

12. The method of claim 10, wherein removing the second oxidized layer additionally reduces the height of each fin.

13. A method of manufacturing a non-volatile memory, the method comprising:
providing a semiconductor substrate;
forming in the semiconductor substrate at least one Shallow Trench Isolation (STI) structure that extends into and above the semiconductor substrate in a height direction;
forming on the semiconductor substrate an array of memory cells, each memory cell comprising a tunnel oxide layer formed on the semiconductor substrate, and a floating gate layer formed on the tunnel oxide layer, wherein adjacent memory cells in the array of memory cells are separated from one another by the at least one STI structure;
partially etching back the at least one STI structure to expose an upper portion of the floating gate layer of each memory cell, wherein the exposed upper portion of each floating gate layer forms a fin with an exposed top and exposed sidewalls;
oxidizing the exposed sidewalls of each fin;
removing a first oxidized layer, thereby reducing the width of each fin, and forming an inverted-T floating gate from each floating gate layer;
forming a hardmask layer on the exposed top of each fin;
removing at least a portion of the hardmask layer; and
etching the at least one STI structure while removing the at least a portion of the hardmask layer.

14. The method of claim 13, wherein the hardmask layer comprises silicon nitride ($Si_3N_4$).

15. The method of claim 13, wherein reducing the width of each fin comprises reducing the width but not the height of each fin.

16. A method of manufacturing a non-volatile memory, the method comprising:
providing a semiconductor substrate;
forming in the semiconductor substrate at least one Shallow Trench Isolation (STI) structure that extends into and above the semiconductor substrate in a height direction;
forming on the semiconductor substrate an array of memory cells, each memory cell comprising a tunnel oxide layer formed on the semiconductor substrate, and a floating gate layer formed on the tunnel oxide layer, wherein adjacent memory cells in the array of memory cells are separated from one another by the at least one STI structure;

partially etching back the at least one STI structure to expose an upper portion of the floating gate layer of each memory cell, wherein the exposed upper portion of each floating gate layer forms a fin with an exposed top and exposed sidewalls;

oxidizing the exposed sidewalls of each fin;

removing a first oxidized layer, thereby reducing the width of each fin, and forming an inverted-T floating gate from each floating gate layer;

forming a hardmask layer on the exposed top of each fin;

further oxidizing the exposed sidewalls of each fin; and removing a second oxidized layer, thereby further reducing the width but not the height of each fin.

* * * * *